(12) United States Patent
Matsuda et al.

(10) Patent No.: US 10,629,790 B2
(45) Date of Patent: Apr. 21, 2020

(54) LIGHT-EMITTING DEVICE

(71) Applicant: NICHIA CORPORATION, Anan-shi, Tokushima (JP)

(72) Inventors: Yoshikazu Matsuda, Tokushima (JP); Masashi Kanazawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/661,683

(22) Filed: Jul. 27, 2017

(65) Prior Publication Data
US 2018/0033934 A1 Feb. 1, 2018

(30) Foreign Application Priority Data

Jul. 27, 2016 (JP) ................................. 2016-147039

(51) Int. Cl.
| | | |
|---|---|---|
| *H01L 33/48* | (2010.01) | |
| *H01L 33/62* | (2010.01) | |
| *H01L 33/10* | (2010.01) | |
| *H01L 33/52* | (2010.01) | |

(52) U.S. Cl.
CPC ............ *H01L 33/62* (2013.01); *H01L 33/486* (2013.01); *H01L 33/10* (2013.01); *H01L 33/52* (2013.01)

(58) Field of Classification Search
CPC ........... H01L 33/00–648; H01L 33/483; H01L 33/486; H01L 33/50–508; H01L 33/52–56; H01L 33/62
See application file for complete search history.

(56) References Cited

U.S. PATENT DOCUMENTS

| | | | |
|---|---|---|---|
| 2006/0091416 A1 | 5/2006 | Yan | |
| 2011/0057218 A1* | 3/2011 | Sorg | H01L 33/486 257/98 |
| 2015/0221623 A1* | 8/2015 | Tischler | H01L 25/165 257/89 |
| 2015/0325748 A1* | 11/2015 | Ting | H01L 33/40 257/98 |
| 2016/0087161 A1* | 3/2016 | Wirth | H01L 24/19 257/88 |

(Continued)

FOREIGN PATENT DOCUMENTS

| | | |
|---|---|---|
| JP | 2006-128701 A | 5/2006 |
| JP | 2012-124443 A | 6/2012 |

(Continued)

*Primary Examiner* — Eric A. Ward
(74) *Attorney, Agent, or Firm* — Foley & Lardner LLP

(57) ABSTRACT

A light-emitting device includes a light-emitting element that includes a layered structure including a semiconductor layer and a pair of electrodes on a first main surface of the layered structure, a light-transmissive member on a second main surface of the layered structure, the second main surface being opposite to the first main surface, a covering member covering lateral surfaces of the light-emitting element and the first main surface of the layered structure except for at least part of the pair of electrodes, a pair of first metal layers on the first main surface of the light-emitting element, the pair of first metal layers covering a surface of the covering member and being respectively connected with the pair of electrodes, and at least one second metal layer separated from the first metal layers.

10 Claims, 19 Drawing Sheets

(56) References Cited

U.S. PATENT DOCUMENTS

| | | | | |
|---|---|---|---|---|
| 2016/0190406 | A1* | 6/2016 | Liu | H01L 33/60 |
| | | | | 257/98 |
| 2017/0005245 | A1* | 1/2017 | Hsu | H01L 33/60 |
| 2017/0018686 | A1* | 1/2017 | Hashimoto | H01L 33/486 |
| 2017/0104141 | A1* | 4/2017 | Park | H01L 33/56 |
| 2018/0040780 | A1* | 2/2018 | Hirasawa | H01L 33/62 |

FOREIGN PATENT DOCUMENTS

| | | |
|---|---|---|
| JP | 2012-138454 A | 7/2012 |
| JP | 2012-146942 A | 8/2012 |
| JP | 2012-227470 A | 11/2012 |
| JP | 2016-015474 A | 1/2016 |

\* cited by examiner

US 10,629,790 B2

LIGHT-EMITTING DEVICE

CROSS-REFERENCE TO RELATED APPLICATIONS

The present application claims priority to Japanese Application No. 2016-147039, filed on Jul. 27, 2016, which is hereby incorporated by reference in its entirety.

BACKGROUND

The present disclosure relates to a light-emitting device.

A slim light-emitting device has been known, in which an encapsulating member made of a resin containing a reflecting material covers the lateral and lower surfaces of a light-emitting element, and plated electrodes are in contact with the lower surfaces of bump electrodes of the light-emitting element and the lower surface of the encapsulating member, instead of a package for housing the light-emitting element (see for example, Japanese Patent Application Publication No. 2012-124443).

A light-emitting device is bonded to a wiring board with an adhesive such as solder. Because the thermal expansion coefficients of the wiring board and the light-emitting device bonded to each other with solder are different, the light-emitting device may be damaged by thermal shock or temperature cycles.

SUMMARY

According to one embodiment, a light-emitting device includes a light-emitting element that includes a layered structure including a semiconductor layer, and a pair of electrodes on a first main surface of the layered structure; a light-transmissive member on a second main surface of the layered structure, the second main surface being opposite to the first main surface; a covering member covering lateral surfaces of the light-emitting element and the first main surface of the layered structure except for at least part of the pair of electrodes; a pair of first metal layers on the first main surface of the light-emitting element, the pair of first metal layers covering a surface of the covering member and being respectively connected with the pair of electrodes; and at least one second metal layer separated from the first metal layers.

The above structure can reduce damage to a light-emitting device bonded to a wiring board with solder.

DETAILED DESCRIPTION

Figure 1A:
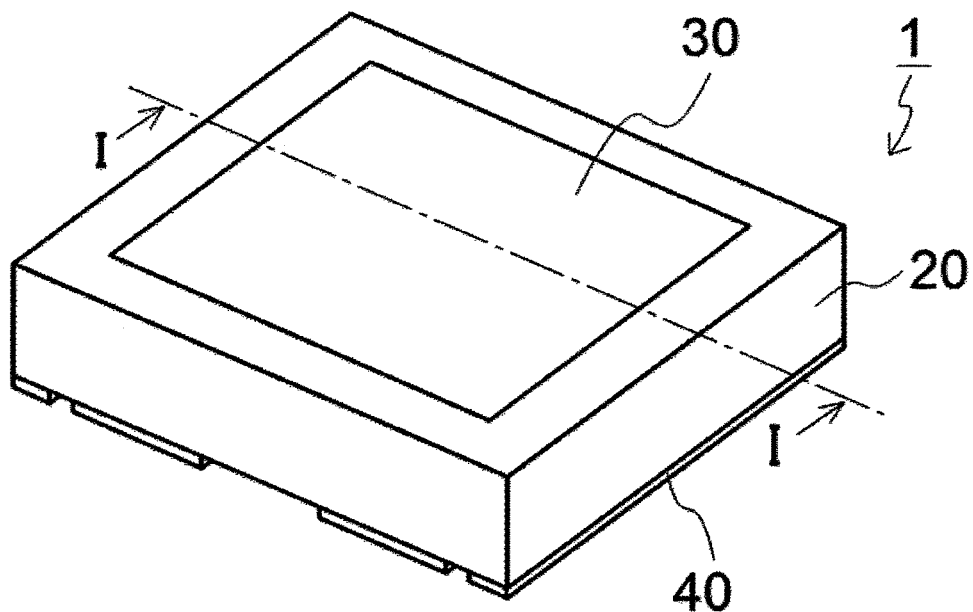
FIG. 1A is a schematic perspective view of a light-emitting device according to a first embodiment from above.
Figure 1B:
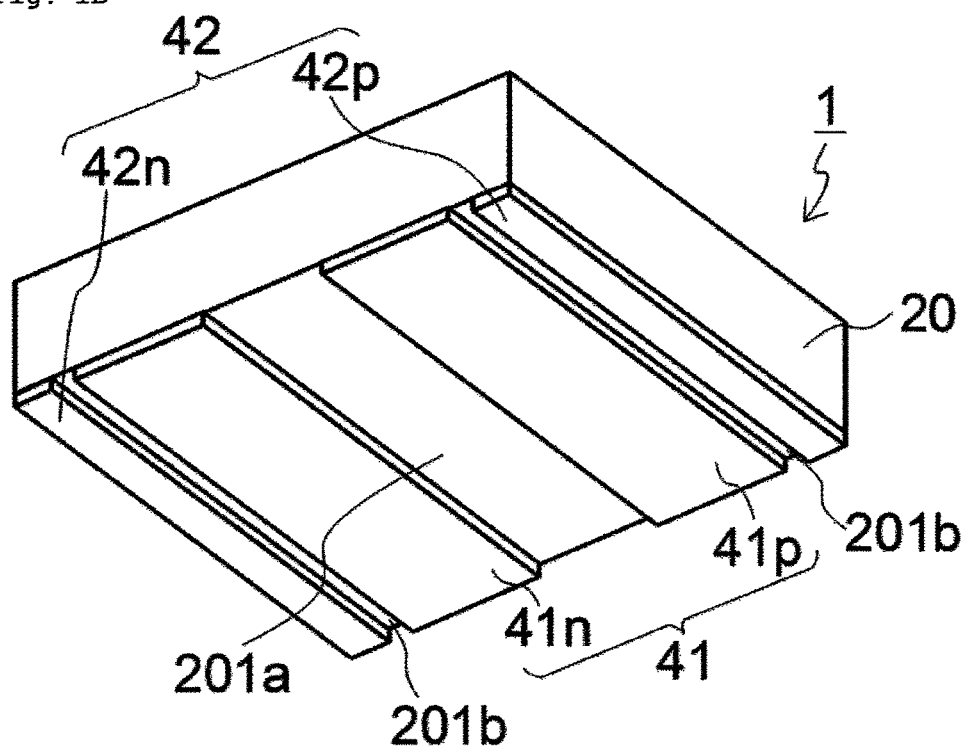
FIG. 1B is a schematic perspective view of the light-emitting device according to the first embodiment from below.

The following describes embodiments of the present invention in detail with reference to the accompanying drawings. The descriptions below use terms indicating specific directions or positions (for example, "up", "down", "right", "left", and other terms containing the meanings of these terms) as appropriate. Use of these terms is, however, intended to facilitate understanding of the invention with reference to the drawings, and the meanings of these terms do not limit the technical scope of the present invention. In certain drawings, a dimension in the up-down direction (longitudinal direction) may be referred to as a "length", and a dimension in the right-left direction (lateral direction) may be referred to as a "width". Portions with the same reference numeral in a plurality of drawings represent the same portion or member. The same names are used to describe resin members such as a first light-transmissive member, a second light-transmissive member, and a covering member regardless of whether or not the members have been shaped, solidified, cured, or singulated. That is, the same name is used to describe such a member the state of which changes depending on stages in the process as to be in a liquid state before being shaped, be in a solid state after being shaped, and be a solid having a different shape through division of the shaped solid.

A light-emitting device according to various embodiments includes a light-emitting element, a covering member, a light-transmissive member, and metal layers. The covering member and the light-transmissive member are resin members that cover the light-emitting element except for electrodes. The metal layers are disposed on the lower surface of the light-emitting device and connected with the pair of electrodes of the light-emitting element. Specifically, the metal layers on the lower surface of the light-emitting element cover the covering member covering the light-emitting element except for the electrodes. Such metal layers function as external connection terminals of the light-emitting device. The light-emitting devices according to the embodiments each include, as the metal layers, first metal layers connected with the pair of electrodes of the light-emitting element, and at least one second metal layer separated from the first metal layers.

To provide good bonding strength between the light-emitting device and a wiring board, the external connection terminals of the light-emitting device preferably have a somewhat large area, in other words, an area at least larger than the area of the electrodes of the light-emitting element. The light-emitting device is preferably connected to the outside via terminals with a somewhat large area as described above also to provide good heat dissipation performance or precise mounting. The light-emitting devices according to the embodiments each include, as the metal layers, the pair of first metal layers and the second metal layer separated from the first metal layers. The first metal layers are connected with the electrodes of the light-emitting element and function as the external connection terminals of the light-emitting device. The first metal layers, which are the external connection terminals, and the second metal layer separated from the first metal layers are bonded to the wiring board with bonding members. In other words, the at least three metal layers including the two first metal layers and the at least one second metal layer are bonded to the wiring board. The total area of the two first metal layers and the at least one second metal layer is larger than the area of the pair of electrodes of the light-emitting element. This structure provides good bonding strength between the light-emitting device and the wiring board.

In the light-emitting devices according to the embodiments, stress exerted on the covering member in bonding is distributed while ensuring a somewhat large area of the bonded portions because not only the two first metal layers, which are the pair of external connection terminals, but also the second metal layer—that is, at least three metal layers total—are bonded to the wiring board. This structure reduces damage to the covering member.

For example, in the case of a light-emitting device including two metal layers each having an area of 300 $\mu m^2$ as the pair of external connection terminals, the total area of the metal layers is 600 $\mu m^2$. On the other hand, in the case of one of the light-emitting devices according to the present embodiments including the two first metal layers each having an area of 200 $\mu m^2$ as the pair of external connection terminals and one second metal layer having an area of 200 $\mu m^2$, the total area of the metal layers is 600 $\mu m^2$. In other words, although both of the above devices have the same total area of the metal layers, the former includes the two metal layers while the latter according to the present embodiments includes the three metal layers. Stress exerted in bonding is distributed by increasing the number of the metal layers and reducing the area of each metal layer without reducing the total area of the bonding area of the light-emitting device.

In addition, the metal layers are preferably disposed so that the light-emitting device is easily bonded to the wiring board at an appropriate position and in an appropriate orientation, in other words, easily self-aligned. In each of the light-emitting devices according to the embodiments, the first metal layers or the second metal layer are disposed on corner portions of the lower surface of the light-emitting device. The metal layers at such positions can function as positioning units for self-alignment. This structure enables the light-emitting device to be precisely disposed at a desired position. The "corner portions" on which the metal layers are disposed include regions including the corners of the lower surface of the light-emitting device and regions separated from but near the corners.

The first metal layers are connected with the electrodes of the light-emitting element as described above and can function as the external connection terminals of the light-emitting device. The first metal layers can function also as the positioning units depending on the size, shape, and positions at which they are formed.

The first metal layers each have an area equal to or larger than the area of each electrode of the light-emitting element in each embodiment. The pair of first metal layers preferably have substantially the same size and shape. For example, polygons such as quadrilaterals including squares and rectangles, triangles, pentagons, and hexagons, shapes formed by cutting off part of such polygons, and shapes formed by rounding off part of such polygons are possible.

The pair of first metal layers can be bilaterally symmetric in shape. The shape and size of the first metal layers are not limited to the above. For example, part of the shape can be cut off to indicate the polarity. Various shapes are possible depending on the shape of the electrodes of the light-emitting element.

The areas of the pair of first metal layers are each equal to or larger than the area of the corresponding electrode to be connected of the light-emitting element. The first metal layers can each have an area equal to or larger than the area of the second metal layer.

The distance between the pair of first metal layers, in other words, the width (for example, $W_{pn}$ in FIG. 1D) of an exposed portion 201a of the lower surface of the covering member, preferably has such an extent that a short circuit due to the spread of bonding members such as solder in bonding to the wiring board or the like is less likely to occur. For example, 20 $\mu m$ or more is preferable, and 50 $\mu m$ or more is more preferable.

One or more second metal layers are disposed on the lower surface of the light-emitting device. The second metal layers can function as auxiliary bonding members for bonding the light-emitting device to the wiring board. The second metal layers can serve as the positioning units in bonding the light-emitting device to the wiring board depending on the size, shape, and positions at which they are formed. Preferably, the second metal layers are bilaterally symmetric in shape on the lower surface of the light-emitting device. Also, the second metal layers are preferably disposed at bilaterally symmetric positions.

Furthermore, the second metal layers may be disposed near the first metal layers. In the case where a bonding member for bonding the light-emitting element to the wiring board is in contact with both of one first metal layer and an adjacent second metal layer, the second metal layer can also function as part of the external connection terminal. In other words, the metal layers including the first metal layer and the second metal layer can function as one quasi external connection terminal. In the case where the second metal layer is used as the external connection terminal as described above, the distance between the first metal layer and the second metal layer can be, for example, 10 μm to 200 μm. This range can be adjusted as appropriate depending on the quantity of bonding members such as solder, the wiring pattern of the wiring board, and the like.

The embodiments below illustrate examples in which the first metal layer or the second metal layer reaches a lateral surface of the light-emitting device, but this structure is not limiting. An end of the first metal layer or the second metal layer may be disposed separated from the lateral surfaces of the light-emitting device. For example, an end of the first metal layer or the second metal layer may be separated from the lateral surfaces of the light-emitting device by a distance in a range of 10 μm to 300 μm. In the case where the first metal layer or the second metal layer reaches a lateral surface of the light-emitting device, the area of the metal layers is large, and the heat dissipation performance is therefore improved. In the case where the first metal layer or the second metal layer does not reach (is separated from) the lateral surfaces of the light-emitting device, singulation can be performed without cutting the metal layers in the manufacturing process. Only members mainly made of resin are cut. That is, only the covering member is cut, or the covering member and the light-transmissive member are cut, thereby facilitating the cutting.

First Embodiment

FIG. 1A to FIG. 1D show a light-emitting device 1 according to a first embodiment. The light-emitting device 1 includes a light-emitting element 10, a covering member 20, a light-transmissive member 30, and metal layers 40. The light-emitting element 10 includes a layered structure 11 including semiconductor layers, and a pair of positive and negative electrodes 12p and 12n. The layered structure 11 has a first main surface 11a and a second main surface 11b opposite to the first main surface. The pair of electrodes 12p and 12n are disposed on the first main surface 11a of the layered structure 11. The light-transmissive member 30 is disposed on the second main surface 11b of the layered structure 11.

The light-transmissive member 30 includes a first light-transmissive member 31 disposed on the second main surface 11b of the layered structure 11 of the light-emitting element 10 and a second light-transmissive member 32 disposed on lateral surfaces 11c of the layered structure 11. The first light-transmissive member 31 is optically connected with the second light-transmissive member 32. The second light-transmissive member 32 is not essential but can be omitted.

The covering member 20 covers the lateral surfaces of the light-emitting element 10 directly or indirectly through other members. Also, the covering member 20 covers the first main surface 11a of the layered structure 11 so that at least part of the pair of electrodes 12p and 12n is exposed. The covering member 20 can be formed through one or more steps. Illustration of borders between portions of the covering member 20 formed through a plurality of steps may be omitted. The covering member 20 also covers the lateral surfaces of the first light-transmissive member 31. As shown in FIG. 1A, the covering member 20 surrounds the first light-transmissive member 31 on the upper surface of the light-emitting device 1.

The metal layers 40 are disposed on the surface of the covering member 20 on the first main surface 11a of the light-emitting element 10, that is, on the lower surface of the light-emitting device 1. The metal layers 40 include a pair of first metal layers 41p and 41n respectively connected with the pair of electrodes 12p and 12n of the light-emitting element 10, and second metal layers 42p and 42n separated from the first metal layers 41p and 41n. This structure distributes stress exerted in bonding the light-emitting device to the wiring board and reduces damage to the light-emitting device. In the first embodiment, the second metal layers 42p and 42n are disposed on the corner portions of the lower surface of the light-emitting device and function as the positioning units in bonding, thereby facilitating self-alignment.

A length L41 of the first metal layers 41p and 41n is preferably equal to or greater than a length Lt of the electrodes 12 of the light-emitting element. Also, the length L41 of the first metal layers 41p and 41n is preferably greater than a length Ld of the layered structure 11 of the light-emitting element. The length L41 of the first metal layers 41p and 41n is preferably substantially the same as a length Lp of the light-emitting device 1. FIG. 1D shows an example in which the first metal layers 41p and 41n each have a rectangular shape and have the length L41 equal to the length Lp of the light-emitting device.

A length L42 of the second metal layers 42p and 42n can be substantially the same as, less than, or greater than the length L41 of the first metal layers 41p and 41n. FIG. 1D shows an example in which the second metal layers 42p and 42n each have a rectangular shape and have the length L42 equal to the length Lp of the light-emitting device and the length L41 of the first metal layers.

A width W41 of the first metal layers 41p and 41n is preferably larger than a width Wt of the electrodes of the light-emitting element. Also, the total width of the first metal layers 41p and 41n, in other words, the distance from the right side of the first metal layer 41p to the left side of the first metal layer 41n in FIG. 1D, is preferably larger than a width Wd of the layered structure 11 of the light-emitting element. In other words, the sum of the width W41 of the first metal layers 41p and 41n and a width Wpn between them is preferably larger than the width Wd of the layered structure.

The width W41 of the first metal layers 41p and 41n can be substantially the same as, larger than, or smaller than a width W42 of the second metal layers 42p and 42n. In FIG. 1D, the width W41 of the first metal layers 41p and 41n is larger than the width W42 of the second metal layers 42p and 42n.

Also, FIG. 1D shows an example in which the distance $W_{pn}$ (width of the exposed portion 201a of the lower surface of the covering member) between the pair of first metal layers is equal to the distance between the electrodes of the light-emitting element. This structure is not limiting, and the distance between the pair of first metal layers may be larger or smaller than the distance between the electrodes of the light-emitting element. Since the upper surfaces of the electrodes of the light-emitting element are required to be covered with the first metal layers, the above-described distance between the first metal layers is the distance between portions other than the portions on the electrodes of the light-emitting element.

A distance Wg1 between the first metal layer 41p (or 41n) and the second metal layer 42p (or 42n) is the width of an exposed portion 201b of the lower surface of the covering member 20. The width Wg1 is preferably small in the case where the second metal layers 42p and 42n function as the external connection terminals. For example, the width Wg1 is preferably smaller than the width of the first metal layers or the width of the second metal layers. Specifically, the width Wg1 can be 10 µm to 200 µm. This range can be adjusted as appropriate depending on the quantity of bonding members such as solder, the wiring pattern of the wiring board, and the like.

In the case where the second metal layers function as the external connection terminals, the first metal layers 41p and 41n are preferably sandwiched between the two second metal layers 42p and 42n disposed separated from first metal layers 41. This structure makes it easy for the first metal layer and the second metal layer to function as one electrically-continuous external connection terminal using a bonding member such as solder.

The whole light-emitting device in addition to the internal structure thereof has been described above for the first embodiment, but the first metal layers and the second metal layers will be described referring to schematic bottom views of the light-emitting device for the following embodiments. Substantially the same constitutions of the light-emitting element, the covering member, the light-transmissive member, and the like as in the first embodiment can be used. In addition, various constitutions of intermediate structures for light-emitting devices before metal layers are formed are illustrated below and can be used for light-emitting devices including the light-emitting device in the first embodiment.
(Modification 1)

Figure 1C:
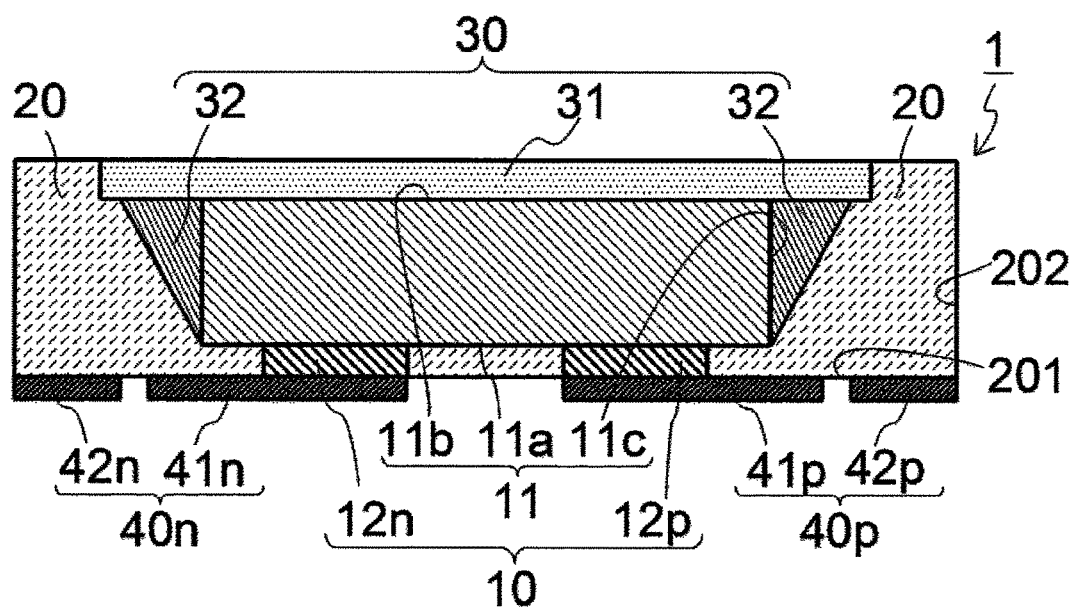
FIG. 1C is a schematic sectional view taken along the line I-I in FIG. 1A.
Figure 1D:
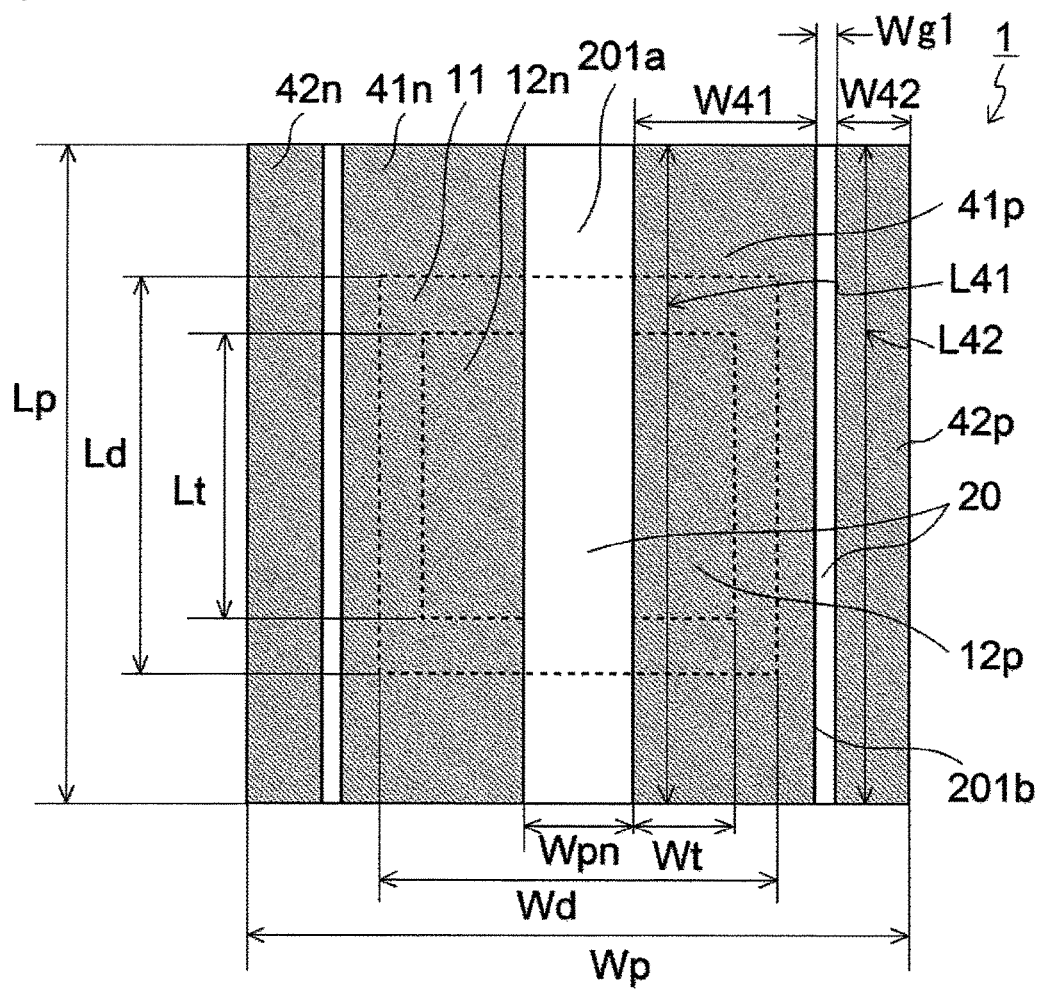
FIG. 1D is a schematic bottom view of the light-emitting device according to the first embodiment.
Figure 1E:
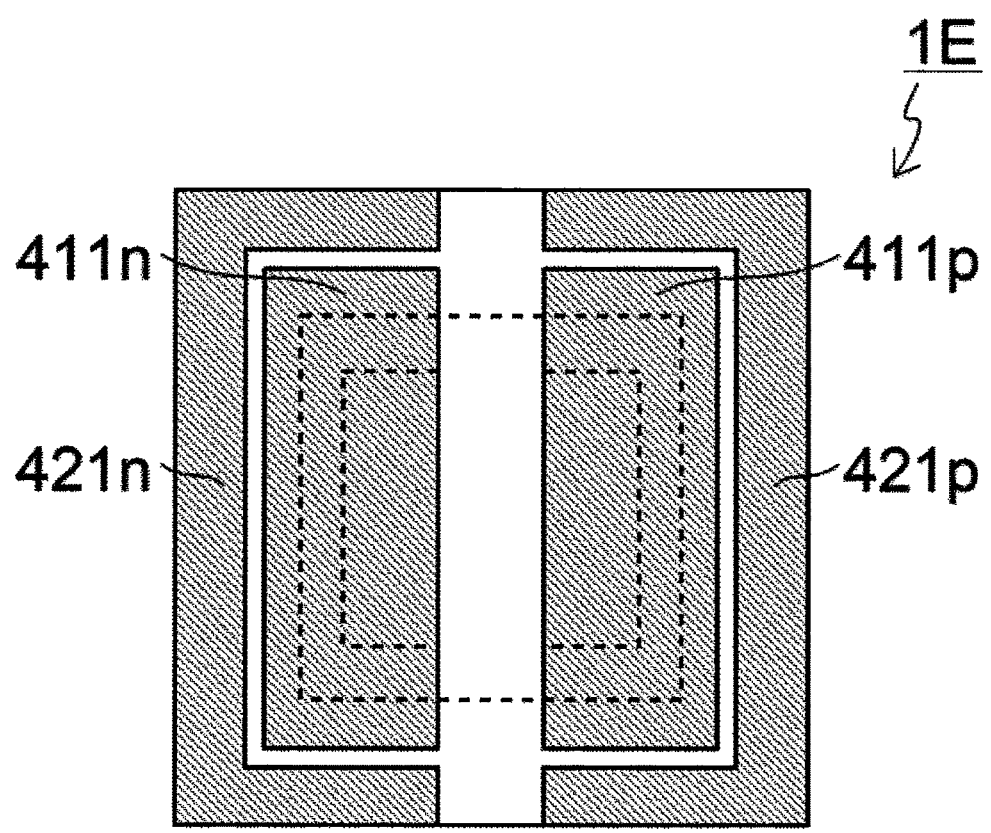
FIG. 1E is a schematic bottom view of a light-emitting device according to a modification of the first embodiment.

FIG. 1E shows Modification 1 of the light-emitting device according to the first embodiment. Modification 1 is the same as the light-emitting device shown in FIG. 1A to FIG. 1D in that two first metal layers are sandwiched between two second metal layers. In Modification 1, the two second metal layers disposed on both sides of the first metal layers in the lateral direction are disposed on both sides of the first metal layers also in the vertical direction. This structure distributes stress exerted in bonding.

As shown in FIG. 1E, two first metal layers 411p and 411n of a light-emitting device 1E each have a quadrilateral shape. Second metal layers 421p and 421n each have such a shape that surrounds the first metal layer 411p or 411n on three sides. The first metal layers 411p and 411n are larger than the electrodes of the light-emitting element in width and length. The two second metal layers 421p and 421n each reach three sides of the light-emitting device. The second metal layers 421p and 421n may be disposed separated from the sides of the light-emitting device. The second metal layers 421p and 421n occupy the four corner portions of the lower surface of the light-emitting device. The second metal layers 421p and 421n disposed at such positions can function as the positioning units for self-alignment in bonding the light-emitting device to the wiring board. An electrically-conductive bonding member for bonding the first metal layer 411p to the wiring board may have contact with the second metal layer 421p. This structure allows the first metal layer 411p and the second metal layer 421p to function as one p-side external connection terminal. Similarly, an electrically-conductive bonding member for bonding the first metal layer 411n to the wiring board may have contact with the second metal layer 421n. This structure allows the first metal layer 411n and the second metal layer 421n to function as one n-side external connection terminal. The second metal layers 421p and 421n each having the shape along three sides of the lower surface of the light-emitting device as shown in FIG. 1E facilitate discharging gases, which may cause voids, in bonding with bonding members such as solder, compared with the second metal layers shown in FIG. 1A to FIG. 1D. Accordingly, formation of voids in regions directly below the electrodes of the light-emitting element is reduced.

Second Embodiment

Figure 2:
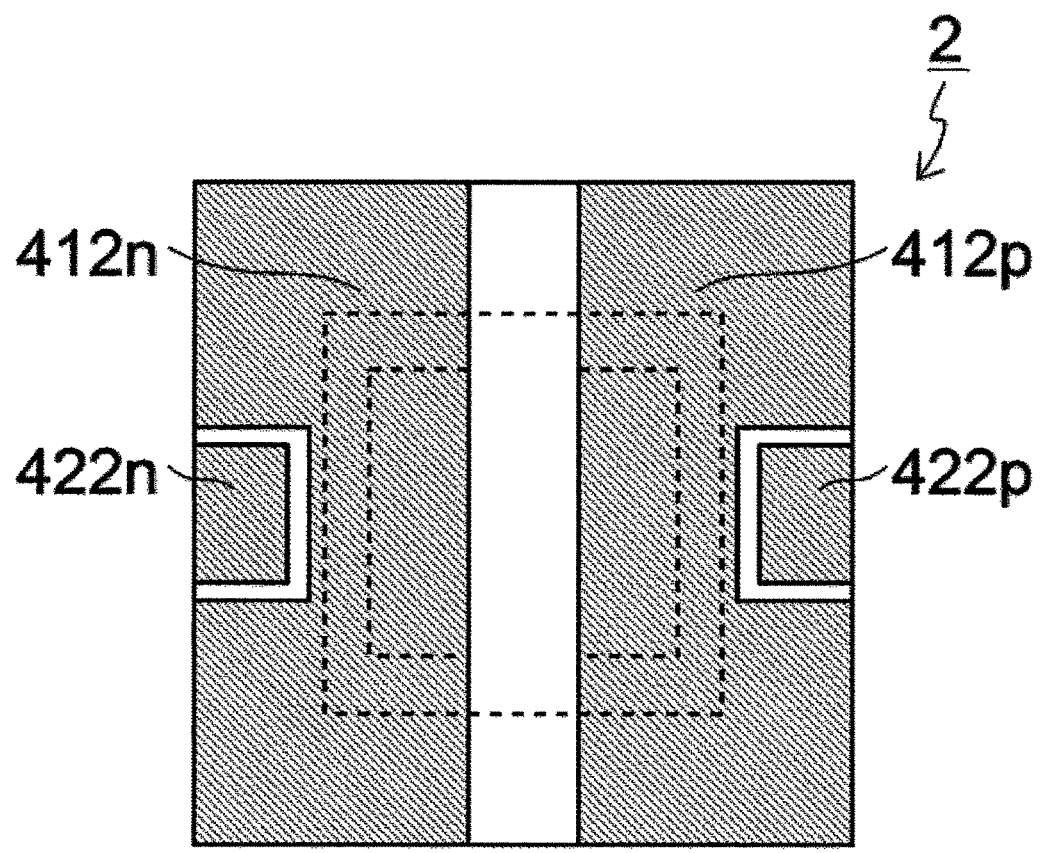
FIG. 2 is a schematic bottom view of a light-emitting device according to a second embodiment.

FIG. 2 shows a light-emitting device according to a second embodiment. As in the first embodiment, two first metal layers and two second metal layers are included in the second embodiment. In a light-emitting device 2, second metal layers 412p and 412n each have a length equal to the length from the upper side to the lower side of the lower surface of the light-emitting device. Also, a first metal layer 412p has a width sufficient to reach the right side, on which the second metal layer 422p is disposed. Similarly, a first metal layer 412n has a width sufficient to reach the left side, on which the second metal layer 422n is disposed.

The two second metal layers 422p and 422n each have a rectangular shape. The first metal layer 412p surrounds the second metal layer 422p on three sides. Similarly, the first metal layer 412n surrounds the second metal layer 422n on three sides. The second metal layers 422p and 422n are smaller than the light-emitting device in width and length. One side of each of the second metal layers 422p and 422n reaches a lateral surface of the light-emitting device. The second metal layers 422p and 422n are disposed separated from the four corner portions of the lower surface of the light-emitting device. This structure distributes stress exerted in bonding and reduces damage to the light-emitting device in bonding to the wiring board. The first metal layers 412p and 412n are disposed on the four corner portions of the lower surface of the light-emitting device. The first metal layers 412p and 412n disposed on the corner portions can function as the positioning units for self-alignment in bonding the light-emitting device to the wiring board. The second metal layers 422p and 422n respectively divide the first metal layers 412p and 412n on two sides (right and left sides) of the lower surface of the light-emitting device. Disposing the first metal layers 412p and 412n on the corner portions of the lower surface of the light-emitting device as shown in FIG. 2 increases the area of the first metal layers, which are directly in contact with the electrodes of the light-emitting element. Hence, good heat dissipation performance is obtained.

Third Embodiment

Figure 3A:
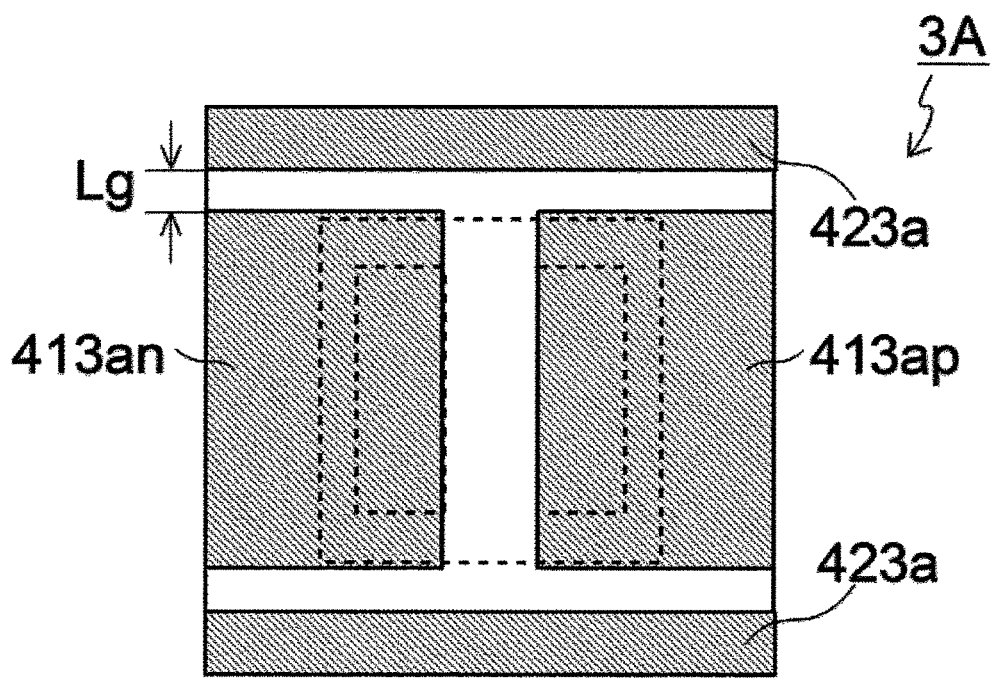
FIG. 3A is a schematic bottom view of a light-emitting device according to a third embodiment.

FIG. 3A shows a light-emitting device according to a third embodiment. In the third embodiment, two second metal layers 423a are each disposed adjacent to both of two first metal layers 413ap and 413an. For this reason, the first metal layers 413ap and 413an are required to have no electrical contact with the second metal layers 412a via electrically-conductive bonding members in the third embodiment. Hence, a length Lg between the first metal layer and the second metal layer is preferably larger than the corresponding length in the case of, for example, the first embodiment where the first metal layer and the second metal layer can be used as one quasi external connection terminal. For example, the distance is preferably 50 μm or more. The second metal layers 423a are bonded to the wiring board with different bonding members from bonding members for bonding the first metal layers to the wiring board. In other words, in a light-emitting device 3A shown in FIG. 3A, bonding members are disposed at four positions and are electrically separated from each other. This structure distributes stress exerted in bonding while maintaining bonding strength between the wiring board and the light-emitting device. Although the second metal layers do not contribute to electrical connection of the light-emitting device, the second metal layers can increase the area of bonding to the wiring board. Such second metal layers do not have contact with the electrodes of the light-emitting element but have contact with the covering member. Since heat generated by the light-emitting element is transferred also to the covering member, the second metal layers at such positions can also contribute to improvement in heat dissipation performance. Bonding strength is also improved.

The first metal layer 413ap has a width equal to the width from the left edge of the electrode of the light-emitting element to the right side of the light-emitting device on the lower surface of the light-emitting device 3A. Similarly, the first metal layer 413an has a width equal to the width from the right edge of the electrode of the light-emitting element to the left side of the light-emitting device on the lower surface of the light-emitting device 3A.

The two second metal layers 423a are respectively formed along the upper and lower sides of the lower surface of the light-emitting device 3A. The second metal layers 423a are formed separated from the upper and lower sides of the first metal layers 413ap and 413an and each have a width equal to the width from the right side of the first metal layer 413ap to the left side of the first metal layer 413an. In other words, the second metal layers 423a each have the same width as the light-emitting device 3A. The second metal layers 423a disposed on the four corner portions of the lower surface of the light-emitting device 3A can function as the positioning units for self-alignment in bonding the light-emitting device to the wiring board.

(Modification 3)

Figure 3B:
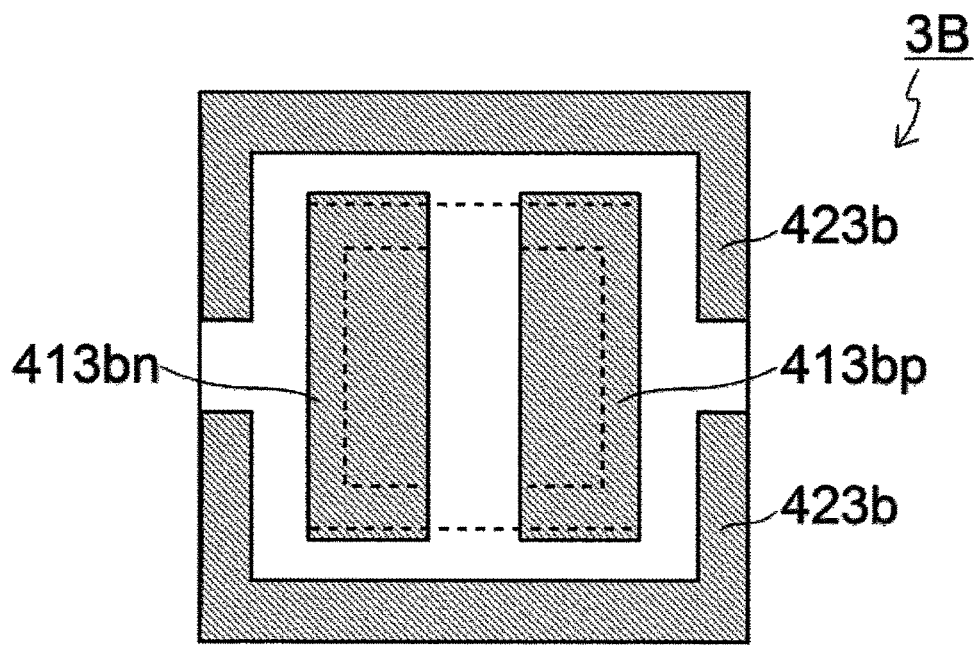
FIG. 3B is a schematic bottom view of a light-emitting device according to the third embodiment.

FIG. 3B shows Modification 3 of the light-emitting device according to the third embodiment. FIG. 3B is the same as FIG. 3A in that each second metal layer is disposed adjacent to both of two first metal layers. On the lower surface of a light-emitting device 3B in Modification 3, first metal layers 413bp and 413bn are disposed separated from the four sides and vertically and laterally sandwiched between two second metal layers 423b. This structure distributes stress exerted in bonding. Also, disposing the second metal layers along all sides (four sides) of the lower surface of the light-emitting device facilitates recognition of the first metal layers with a camera before bonding to the wiring board. Since the first metal layers are connected with the electrodes of the light-emitting element, recognizing the positions of the first metal layers enables alignment with the center position of the light-emitting element in bonding to the wiring board. For example, facilitating recognition of the first metal layer as described above makes it easy to align the center position of the light-emitting element even in the case where the thickness of the covering member around the light-emitting element varies, in other words, in the case where the center of the light-emitting device is out of alignment with the center of the light-emitting element.

The second metal layers 423b disposed on the four corner portions of the lower surface of the light-emitting device 3B can function as the positioning units for self-alignment in bonding the light-emitting device to the wiring board. In FIG. 3B, the second metal layers 423b are close to each other on the right and left sides of the light-emitting device. The distance between the second metal layers 423b is preferably long enough to prevent a short circuit due to contact of bonding members with each other.

Fourth Embodiment

Figure 4:
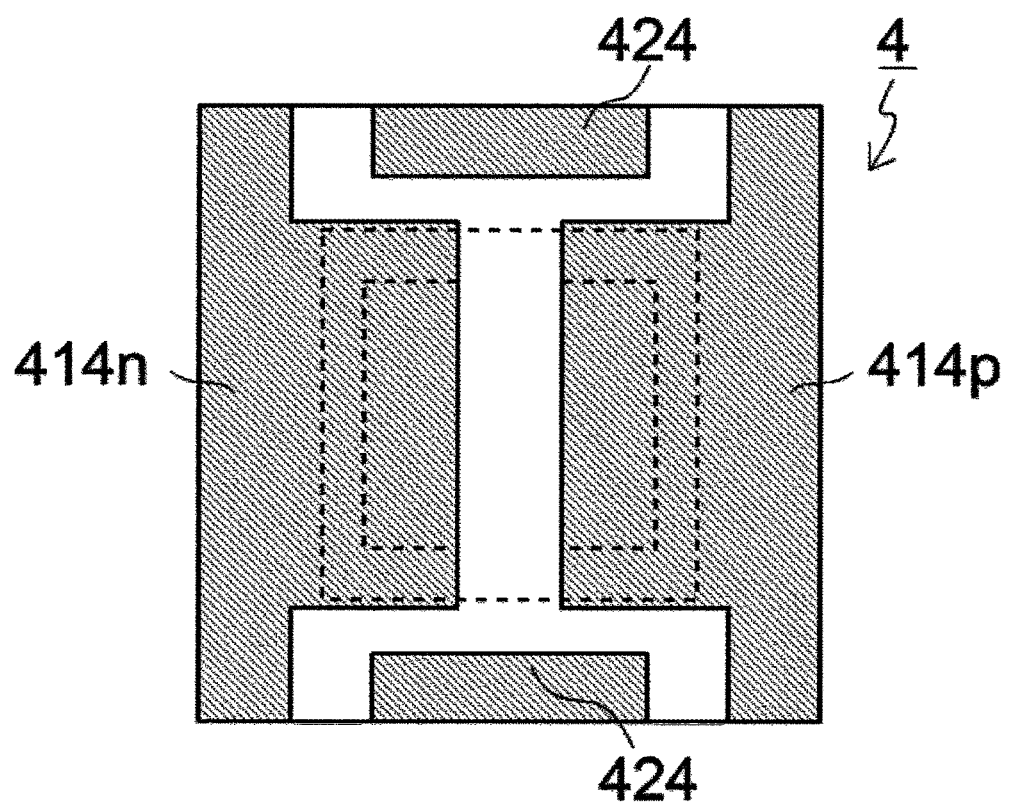
FIG. 4 is a schematic bottom view of a light-emitting device according to a fourth embodiment.

FIG. 4 shows a light-emitting device 4 according to a fourth embodiment. The fourth embodiment is the same as the third embodiment in that two second metal layers 424 are each disposed adjacent to both of two first metal layers 414p and 414n. In the fourth embodiment, the first metal layers 414p and 414n each have a length equal to the length from the upper side to the lower side of the lower surface of the light-emitting device on the right and left sides. The second metal layers 424 are respectively disposed on the upper and lower sides of a plane of the light-emitting device. Hence, the second metal layers 424 are laterally sandwiched between the first metal layers 414p and 414n. This structure distributes stress exerted in bonding. The first metal layers 414 disposed on the four corner portions of the lower surface of the light-emitting device 4 can function as the positioning units for self-alignment in bonding the light-emitting device to the wiring board. The second metal layers 424 can be used as auxiliary bonding members.

Fifth Embodiment

FIG. 5A to FIG. 5G show light-emitting devices according to a fifth embodiment. Two first metal layers and four second metal layers are included in the fifth embodiment.

Figure 5A:
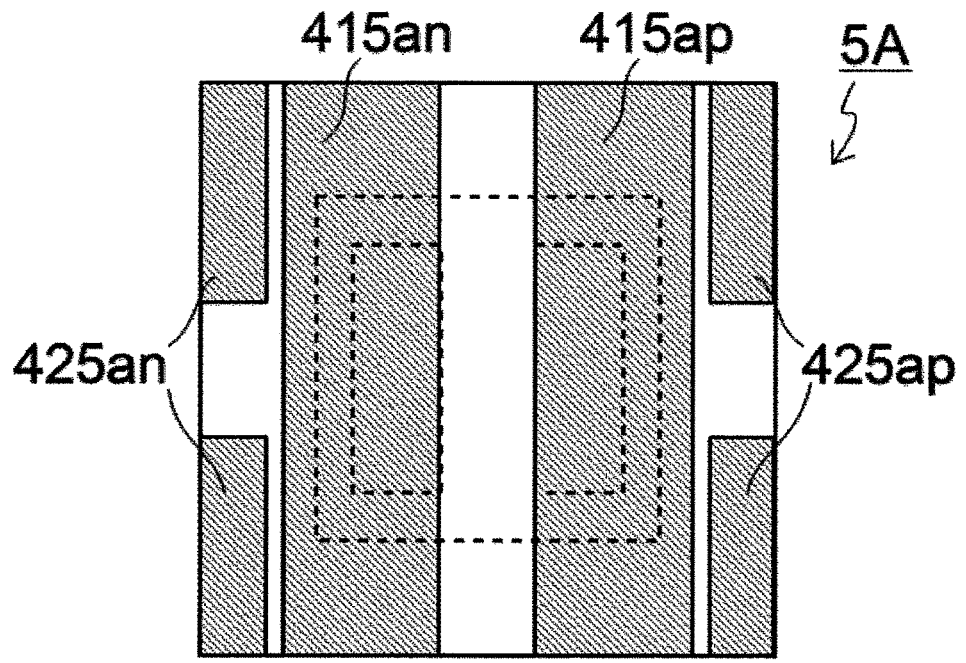
FIG. 5A is a schematic bottom view of a light-emitting device according to a fifth embodiment.

In a light-emitting device 5A shown in FIG. 5A, two second metal layers 425ap formed along the right side of the lower surface of the light-emitting device have quadrilateral shapes with substantially the same length and width. Similarly, two second metal layers 425an formed along the left side of the lower surface of the light-emitting device 5A also have quadrilateral shapes with substantially the same length and width. Two first metal layers 415ap and 415an are sandwiched between the two second metal layers 425ap on the right side and the two second metal layers 425an on the left side. The second metal layers 425ap and 425an disposed on the four corner portions of the lower surface of the light-emitting device 5A can function as the positioning units for self-alignment in bonding the light-emitting device to the wiring board. The second metal layers shown in FIG. 1D disposed along the right and left sides of the lower surface of the light-emitting device extend from the upper side to the lower side, but the second metal layers shown in FIG. 5A have shapes obtained by dividing the second metal layers shown in FIG. 1D. In other words, the second metal layers 425ap and 425an shown in FIG. 5A are shorter in length than the second metal layers 42p and 42n shown in FIG. 1D. In the case where the distance between the adjacent two second metal layers 425ap (or 425an) is short, a bonding member for bonding the light-emitting device to the wiring board is connected to both of the two second metal layers 425ap (or 425an) adjacent to each other. If these two second metal layers 425ap (or 425an) are disposed near the first metal layer 415ap (or 415an), these three metal layers can function as one quasi external connection terminal. This structure enables the light-emitting device to be bonded to the wiring board without decreasing bonding strength. A greater number of the second metal layers, that is, the second metal layers shown in FIG. 5A, provide a greater effect of distributing stress.

Figure 5B:
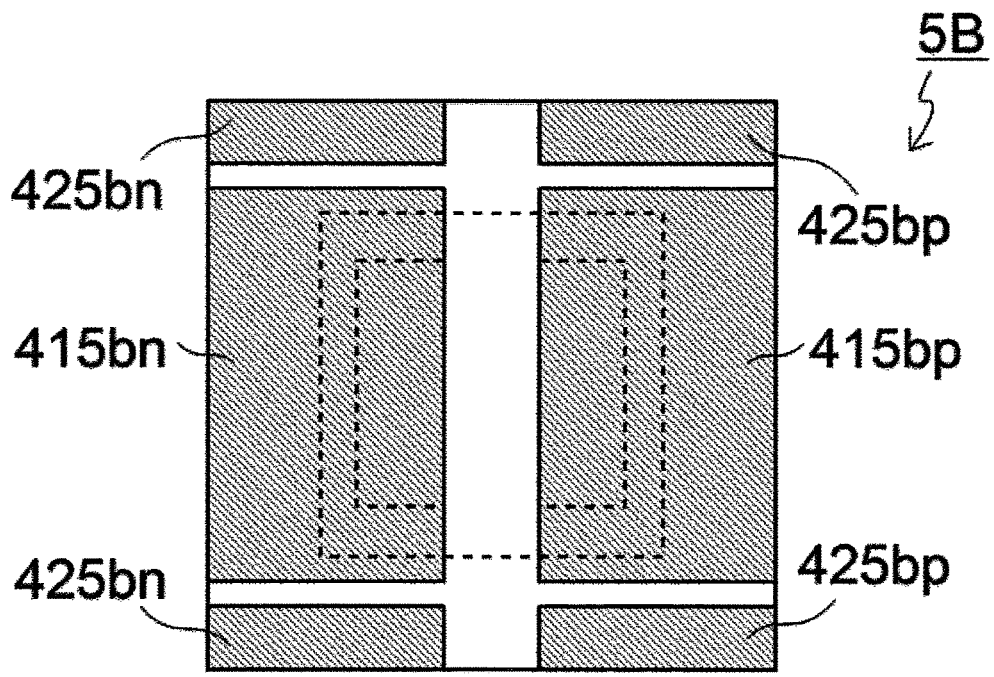
FIG. 5B is a schematic bottom view of a light-emitting device according to the fifth embodiment.

In a light-emitting device 5B shown in FIG. 5B, a first metal layer 415*bp* on the lower surface of the light-emitting device is vertically sandwiched between two second metal layers 425*bp*. Similarly, a first metal layer 415*bn* is vertically sandwiched between two second metal layers 425*bn*. The four second metal layers have rectangular shapes with the same width and length. The first metal layers 415*bp* and 415*bn* and the second metal layers 425*bp* and 425*bn* are the same in width. This structure distributes stress exerted in bonding. The second metal layers 425*bp* and 425*bn* disposed on the four corner portions of the lower surface of the light-emitting device 5B can function as the positioning units for self-alignment in bonding the light-emitting device to the wiring board. The second metal layers shown in FIG. 3A disposed along the right and left sides of the lower surface of the light-emitting device extend from the upper side to the lower side, but the second metal layers shown in FIG. 5B have shapes obtained by dividing the second metal layers shown in FIG. 3A. The second metal layers 425*bp* (or 425*bn*) may be electrically connected with the first metal layer 415*bp* (or 415*bn*) via bonding members for bonding the light-emitting device to the wiring board. Hence, the distance between the first metal layer 415*bp* (or 415*bn*) and the second metal layers 425*bp* (or 425*bn*) shown in FIG. 5B is smaller than the distance between the first metal layer and the second metal layers shown in FIG. 3A. If the first metal layer 415*bp* (or 415*bn*) is disposed near the two second metal layers 425*bp* (or 425*bn*) above and below it, these three metal layers can function as one quasi external connection terminal. This structure enables the light-emitting device to be bonded to the wiring board without decreasing bonding strength.

Figure 5C:
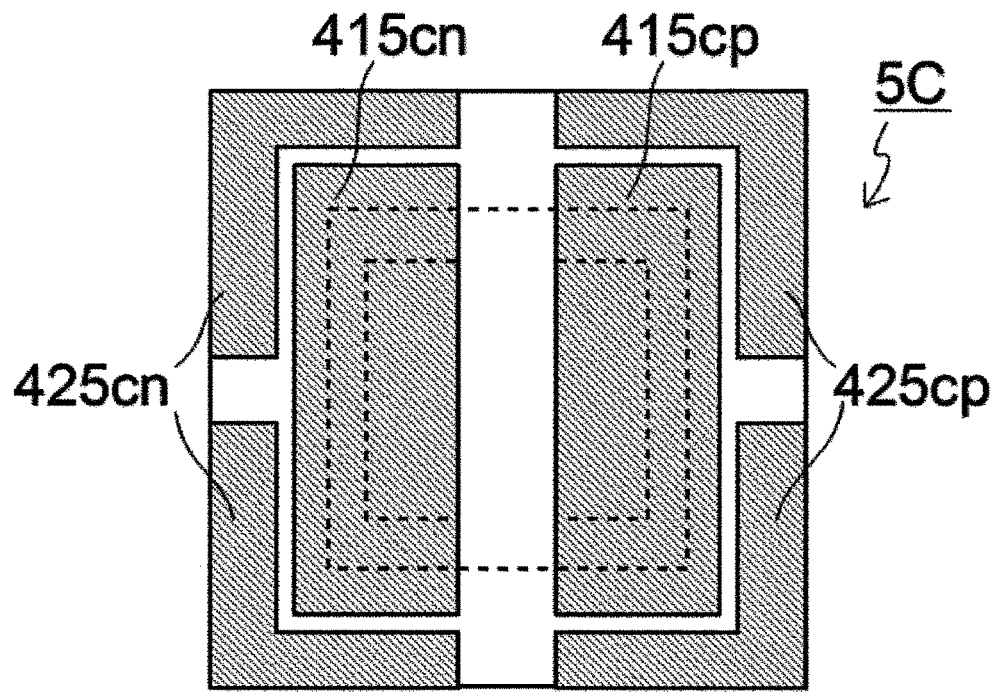
FIG. 5C is a schematic bottom view of a light-emitting device according to the fifth embodiment.

In a light-emitting device 5C shown in FIG. 5C, a first metal layer 415*cp* on the lower surface of the light-emitting device is vertically sandwiched between two second metal layers 425*cp*. Also, the two second metal layers 425*cp* extend from the corner portions of the lower surface of the light-emitting device to face the right side of the first metal layer 415*cp*. Similarly, a first metal layer 415*cn* is vertically sandwiched between two second metal layers 425*cn*. Also, the two second metal layers 425*cn* extend from the corner portions of the lower surface of the light-emitting device to face the left side of the first metal layer 415*cn*. In other words, the four second metal layers 425*cp* and 425*cn* each have an L shape, and the two first metal layers 415*cp* and 415*cn* are laterally sandwiched between the four second metal layers. The second metal layers 425*cp* face the second metal layers 425*cn* on the upper and lower sides of the lower surface of the light-emitting device. Also, pai of the second metal layers 425*cp* and pair of the second metal layers 425*cn* face each other on the right and left sides of the lower surface of the light-emitting device. That is, the four second metal layers are formed along the four sides of the lower surface of the light-emitting device, and the two first metal layers are disposed in the region surrounded by the second metal layers. Neither of the first metal layers 415*cp* and 415*cn* reaches the lateral surfaces of the lower surface of the light-emitting device. This structure distributes stress exerted in bonding.

The second metal layers 425*cp* and 425*cn* disposed on the four corner portions of the lower surface of the light-emitting device 5C can function as the positioning units for self-alignment in bonding the light-emitting device to the wiring board. The second metal layers shown in FIG. 5C have shapes obtained by dividing the second metal layers shown in FIG. 1E. The second metal layers 425*cp* (or 425*cn*) may be electrically connected with the first metal layer 415*cp* (or 415*cn*) via bonding members for bonding the light-emitting device to the wiring board. This connection allows these three metal layers to function as one quasi external connection terminal. This structure enables the light-emitting device to be bonded to the wiring board without decreasing bonding strength.

Figure 5D:
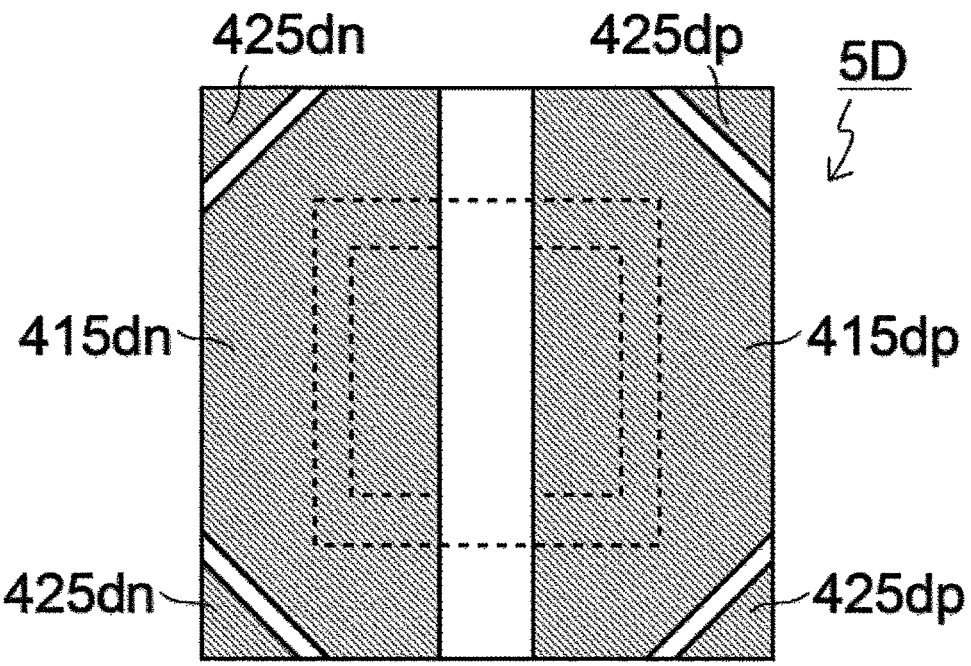
FIG. 5D is a schematic bottom view of a light-emitting device according to the fifth embodiment.

In a light-emitting device 5D shown in FIG. 5D, second metal layers are disposed on the four corner portions of the lower surface of the light-emitting device. Second metal layers 425*dp* and 425*dn* each have a triangular shape, and first metal layers 415*dp* and 415*dn* each have a shape obtained by chamfering two corner portions of a quadrilateral, that is, a hexagonal shape. This structure distributes stress exerted in bonding. The second metal layers 425*dp* and 425*dn* disposed on the four corner portions of the lower surface of the light-emitting device 5D can function as the positioning units for self-alignment in bonding the light-emitting device to the wiring board. The second metal layers 425*dp* (or 425*dn*) may be electrically connected with the first metal layer 415*dp* (or 415*bn*) via bonding members for bonding the light-emitting device to the wiring board. This connection allows these three metal layers to function as one quasi external connection terminal. This structure enables the light-emitting device to be bonded to the wiring board without decreasing bonding strength.

Figure 5E:
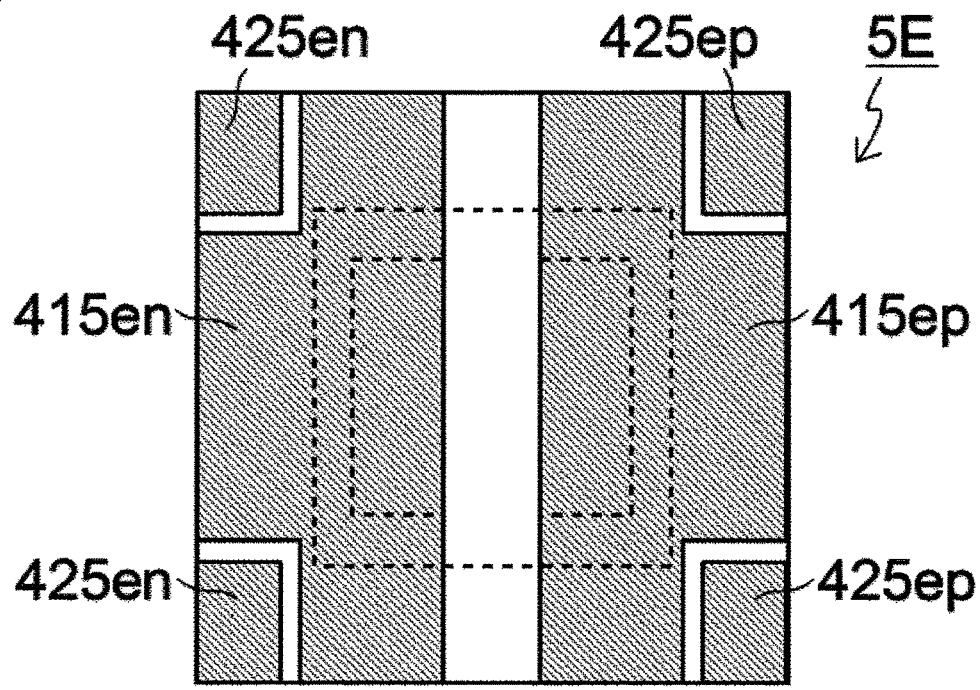
FIG. 5E is a schematic bottom view of a light-emitting device according to the fifth embodiment.

In a light-emitting device 5E shown in FIG. 5E, second metal layers are disposed on the four corner portions of the lower surface of the light-emitting device. Second metal layers 425*ep* and 425*en* each have a quadrilateral shape. First metal layers 415*ep* and 415*en* each have a shape obtained by cutting out corner portions of the lower surface of the light-emitting device and each reach three sides except for the corner portions. This structure distributes stress exerted in bonding. The second metal layers 425*ep* and 425*en* disposed on the four corner portions of the lower surface of the light-emitting device 5E can function as the positioning units for self-alignment in bonding the light-emitting device to the wiring board. The second metal layers 425*ep* (or 425*en*) may be electrically connected with the first metal layer 415*ep* (or 415*en*) via bonding members for bonding the light-emitting device to the wiring board. This connection allows these three metal layers to function as one quasi external connection terminal. This structure enables the light-emitting device to be bonded to the wiring board without decreasing bonding strength.

Figure 5F:
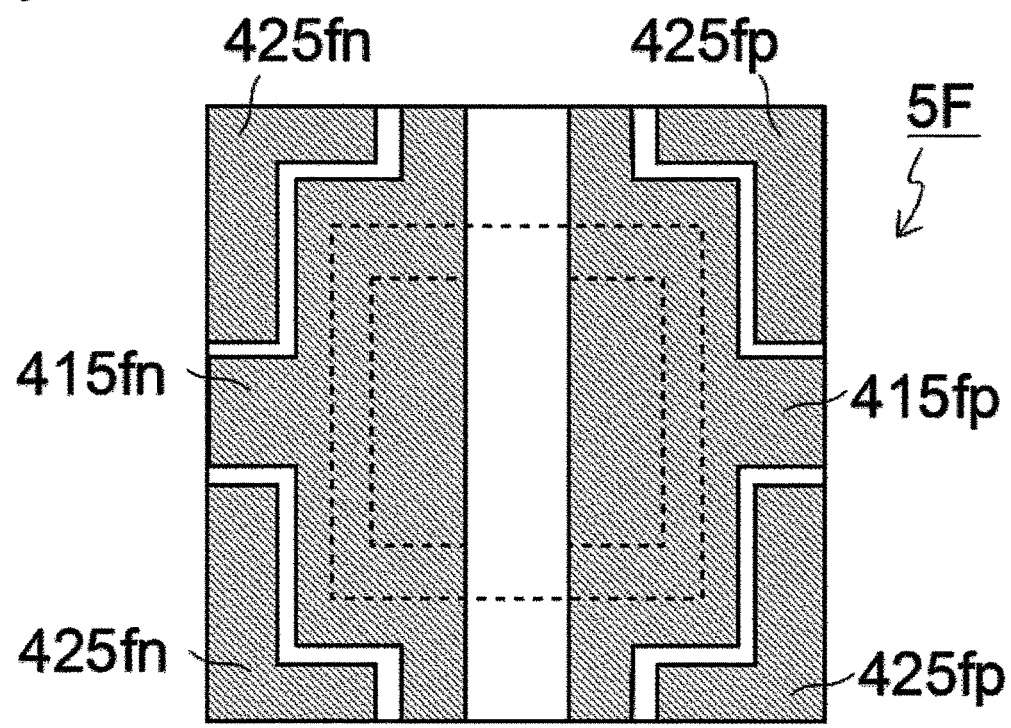
FIG. 5F is a schematic bottom view of a light-emitting device according to the fifth embodiment.

In a light-emitting device 5F shown in FIG. 5F, a first metal layer 415*fp* on the lower surface of the light-emitting device is vertically sandwiched between two second metal layers 425*fp*. Similarly, a first metal layer 415*fn* is vertically sandwiched between two second metal layers 425*fn*. The four L-shaped second metal layers are formed on the corner portions of the lower surface of the light-emitting device. This structure distributes stress exerted in bonding. These second metal layers can function as the positioning units for self-alignment in bonding the light-emitting device to the wiring board. While the second metal layers each have an L shape and the first metal layers do not reach any sides of the lower surface of the light-emitting device in FIG. 5C, the first metal layers 415*fp* and 415*fn* in FIG. 5F each reach three sides of the lower surface of the light-emitting device. That is, the two second metal layers 425*fp* (or 425*fn*) face each other across the first metal layer 415*fp* (or 415*fn*). The second metal layers 425*fp* face the second metal layers 425*fn* across the first metal layer 415*fp* and the first metal layer 415*fn*. The second metal layers 425*fp* (or 425*fn*) may be electrically connected with the first metal layer 415*fp* (or 415*fn*) via bonding members for bonding the light-emitting device to the wiring board. If the first metal layer 415*fp* (or 415*fn*) is disposed near the two second metal layers 425*fp* (or 425*fn*) above and below it, these three metal layers can function as one quasi external connection terminal. This structure enables the light-emitting device to be bonded to the wiring board without decreasing bonding strength.

Figure 5G:
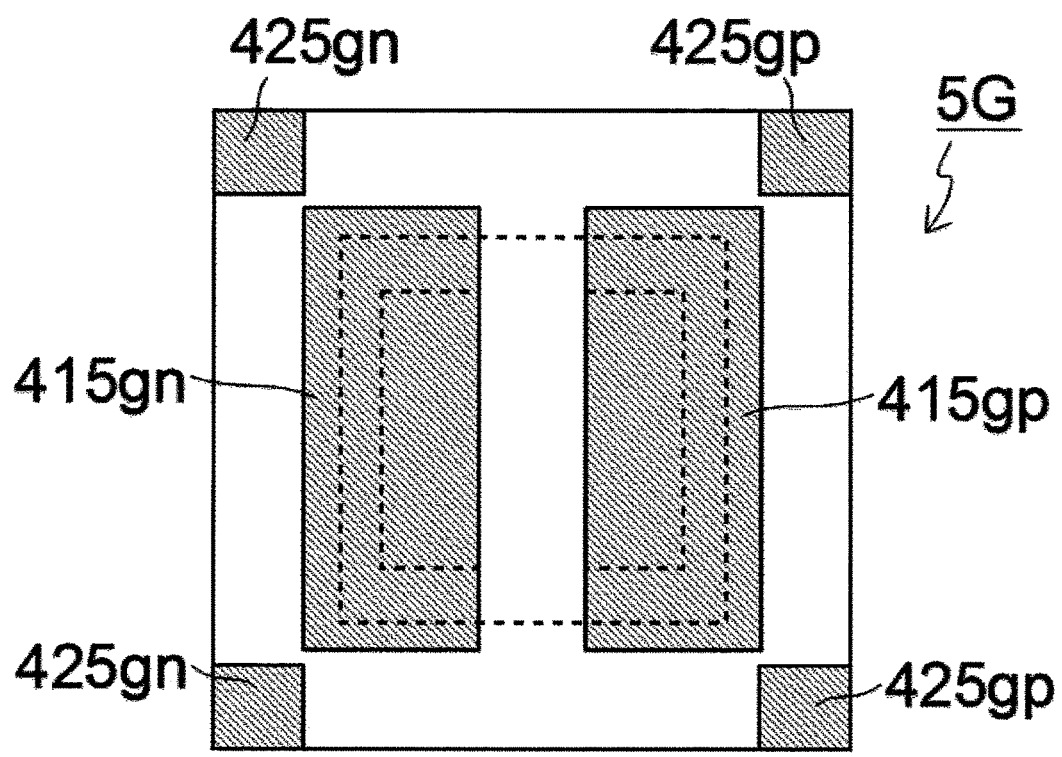
FIG. 5G is a schematic bottom view of a light-emitting device according to the fifth embodiment.

In a light-emitting device 5G shown in FIG. 5G, quadrilateral second metal layers are disposed on the corner portions of the lower surface of the light-emitting device. While the light-emitting devices shown in FIG. 5A to FIG. 5F each have the first metal layers vertically or laterally sandwiched between the second metal layers on the lower surface of the light-emitting device, first metal layers 415*gp* and 415*gn* are substantially not sandwiched between second metal layers 425*gp* and 425*gn* shown in FIG. 5G. This structure distributes stress exerted in bonding. The second metal layers 425*gp* (or 425*gn*) disposed so that the corner portions thereof are close to corner portions of the first metal layer 415*gp* (or 415*gn*) can function as the positioning units for self-alignment in bonding the light-emitting device to the wiring board.

Figure 5H:
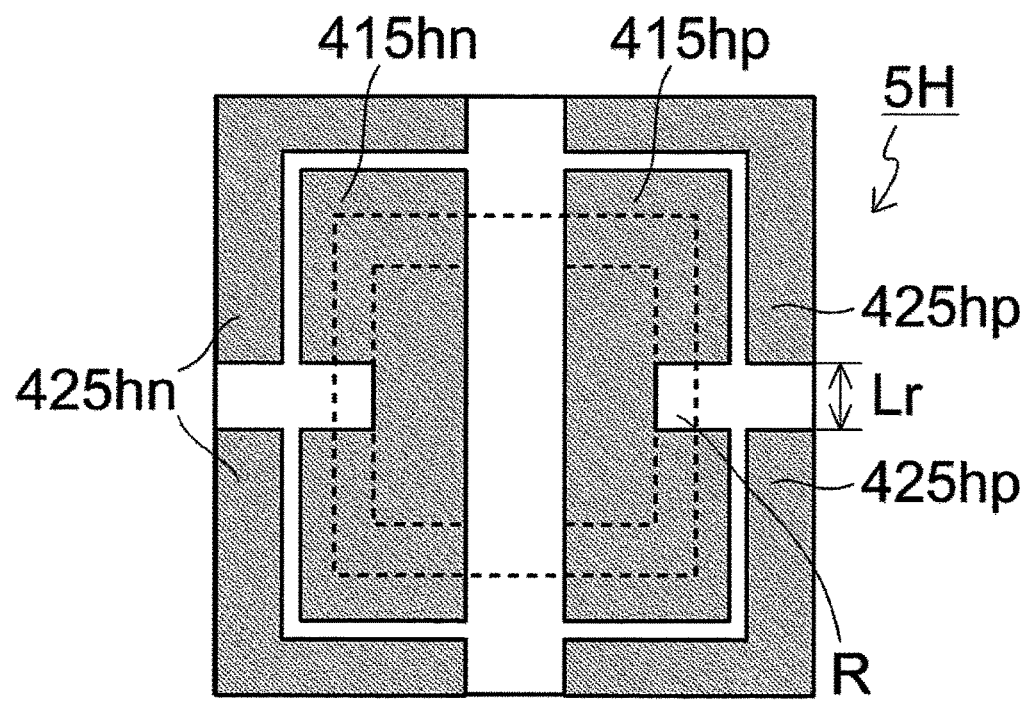
FIG. 5H is a schematic bottom view of a light-emitting device according to the fifth embodiment.

A light-emitting device 5H shown in FIG. 5H includes second metal layers 425*hp* and 425*hn* having the same shape as the second metal layers 425*cp* and 425*cn* of the light-emitting device 5C shown in FIG. 5C. In the light-emitting device 5H, first metal layers 415*hp* and 415*hn* each have a recess R. The recess R has a length Lr equal to the distance between the two second metal layers 425*hp*. Such recesses R enable the light-emitting device to be bonded to the wiring board in accordance with the center of the light-emitting element.

Sixth Embodiment

Figure 6:
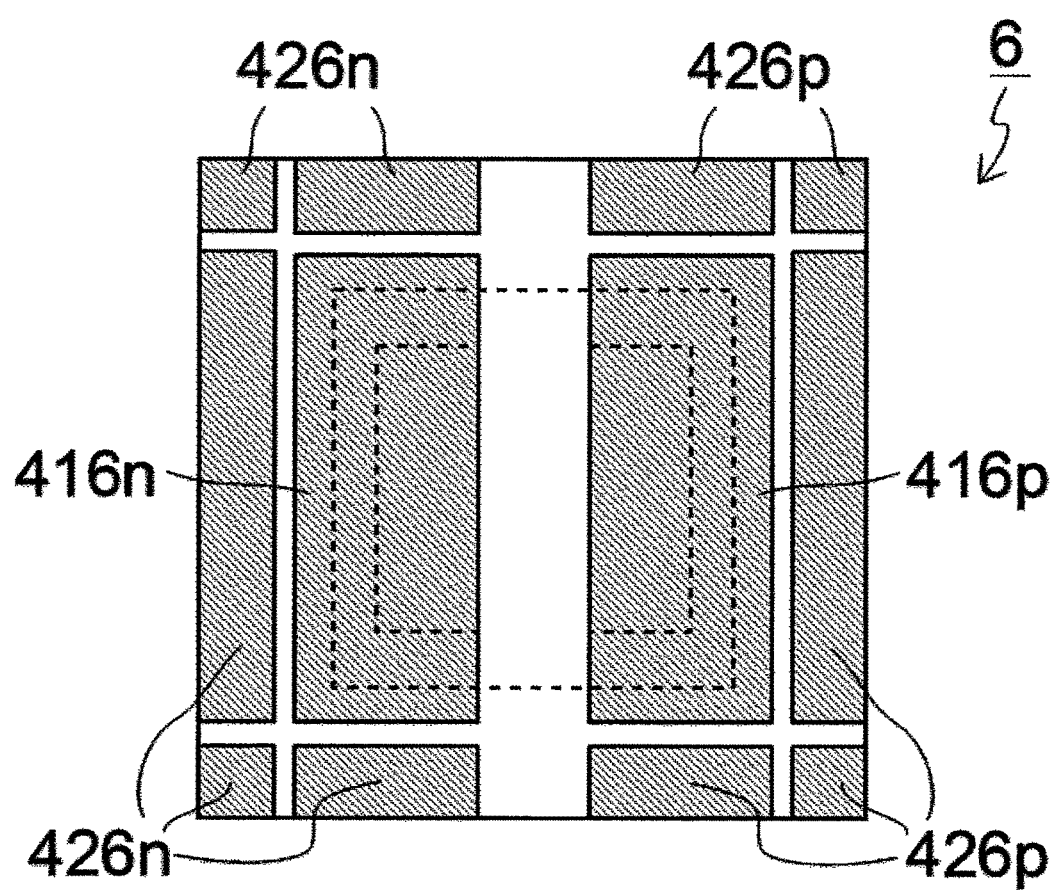
FIG. 6 is a schematic bottom view of a light-emitting device according to a sixth embodiment.

FIG. 6 shows a light-emitting device 6 according to a sixth embodiment. Two first metal layers 416*p* and 416*n* and ten second metal layers are included in the sixth embodiment. Specifically, five second metal layers 426*p* surrounding the first metal layer 416*p* and five second metal layers 426*n* surrounding the first metal layer 416*n* are included. The second metal layers 426*p* (or 426*n*) include two second metal layers 426*p* (or 426*n*) having the same width as the first metal layer 416*p* (or 416*n*) and being disposed above and below the first metal layer 416*p* (or 416*n*), one second metal layer 426*p* (or 426*n*) disposed on the right side (or the left side) of the first metal layer 416*p*, and two second metal layers 426*p* (or 426*n*) on the corner portions of the first metal layer 416*p* (or 416*n*). Such second metal layers divided into many pieces can more sparsely distribute stress exerted in bonding while maintaining bonding strength between the wiring board and the light-emitting device. Also, the second metal layers 426*p* and 426*n* disposed on the corner portions enables the light-emitting device to be precisely bonded at a desired position on the wiring board.

Seventh Embodiment

Figure 7:
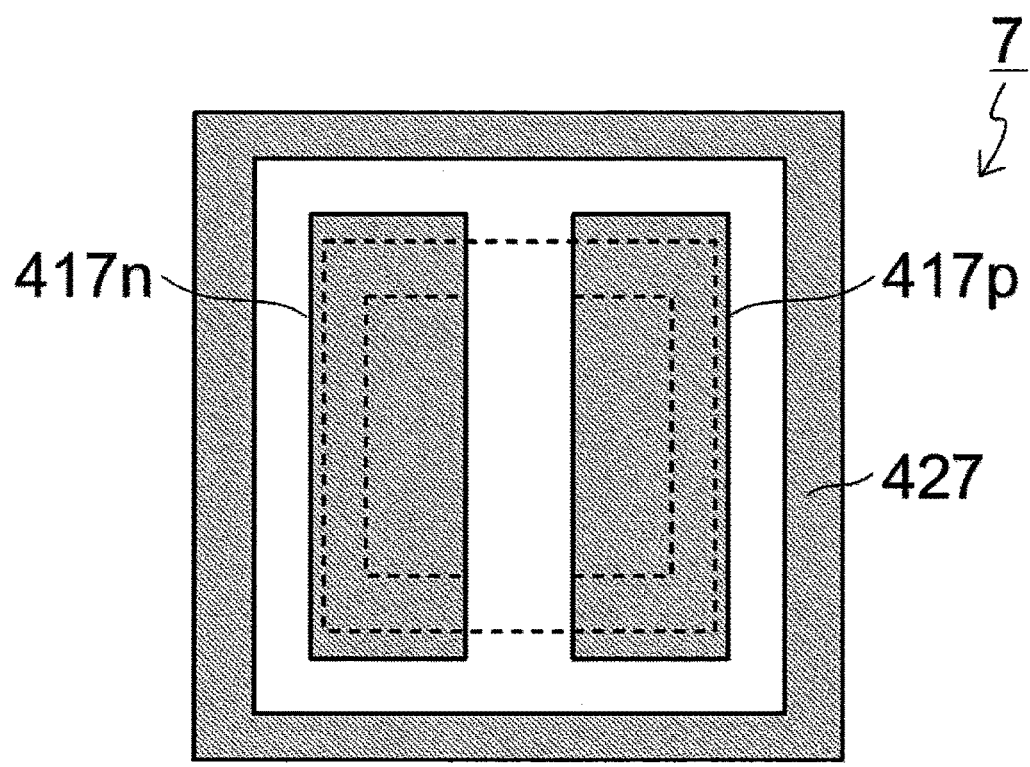
FIG. 7 is a schematic bottom view of a light-emitting device according to the seventh embodiment.

FIG. 7 shows a light-emitting device 7 according to a seventh embodiment. Two first metal layers 417*p* and 417*n* and one second metal layer 427 around the entire periphery of the first metal layers 417*p* and 417*n* are included in the seventh embodiment. This structure distributes stress exerted in bonding. The second metal layer 427 is required to be wide apart from the two first metal layers 417 so that the second metal layer 427 has contact with neither of the two first metal layers 417. The second metal layer 427 around the entire periphery on the lower surface of the light-emitting device can function as the positioning unit for self-alignment in bonding the light-emitting device to the wiring board. Also, stress exerted in bonding is distributed.

The embodiments including two, four, five, or one second metal layer have been described above, but these embodiments are not limiting. Three or six or more second metal layers are possible. For example, among the five second metal layers 426*p* (or 426*n*) in the light-emitting device 6 shown in FIG. 6, connecting two second metal layers on the upper side and connecting two second metal layers on the lower side result in three second metal layers. Alternatively, in FIG. 6, connecting the three second metal layers on the right side results in three second metal layers.

A method for manufacturing the light-emitting device according to any of the above embodiments will be described referring to FIG. 8A to FIG. 8E and FIG. 9.

(Providing Intermediate Structure)

Figure 8A:
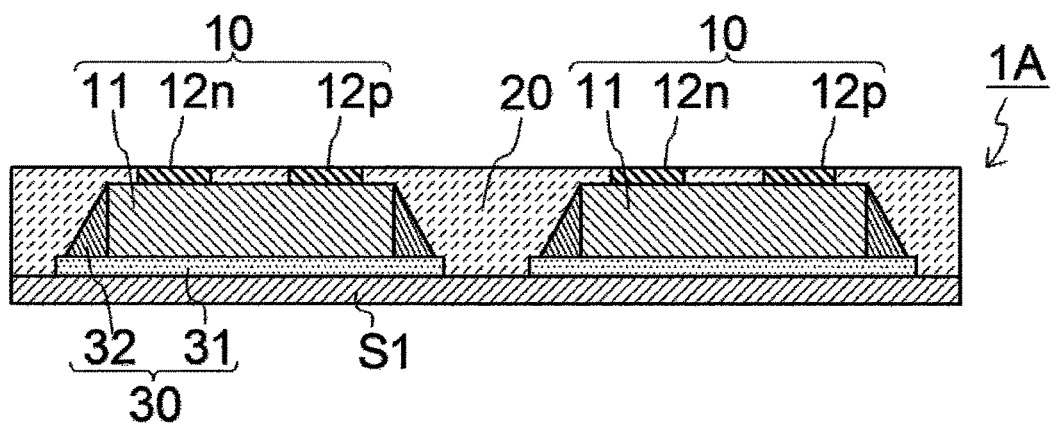
FIG. 8A is a schematic sectional view for illustrating a method for manufacturing the light-emitting devices according to the embodiments.

An intermediate structure 1A including the light-emitting elements 10 and the covering member 20 is provided as shown in FIG. 8A. The intermediate structure 1A is disposed on a sheet 51. The light-emitting elements 10 each include the layered structure 11 and the pair of electrodes 12*p* and 12*n* on the same side of the layered structure 11. The covering member 20 covers the light-emitting elements 10 so that at least part of the surfaces of the pairs of electrodes 12*p* and 12*n* is exposed. One intermediate structure 1A includes a plurality of light-emitting elements 10 regularly arranged in the longitudinal direction and the lateral direction and integrally covered with the covering member 20. For ease of illustration, two light-emitting elements are illustrated in FIG. 8A to FIG. 8E, but this number is not limiting.

The distance between the light-emitting elements can be selected as appropriate depending on the intended sizes of the light-emitting device and the light-emitting element. The light-emitting elements are arranged in consideration of the width of a portion to be cut (width of a cutting blade) because singulation is performed later by cutting the covering member.

(Forming Metal Layer)

Figure 8B:
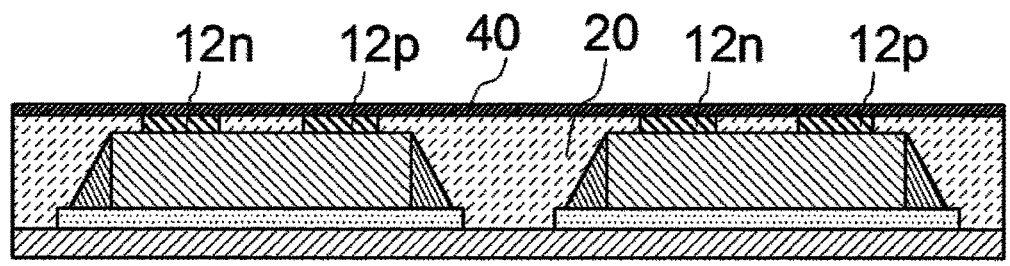
FIG. 8B is a schematic sectional view for illustrating the method for manufacturing the light-emitting devices according to the embodiments.

Subsequently, the metal layer 40 is formed to continuously cover the exposed pairs of electrodes 12*p* and 12*n* and the covering member 20 as shown in FIG. 8B. The metal layer 40 can be formed by sputtering, vacuum evaporation, atomic layer deposition (ALD), metal organic chemical vapor deposition (MOCVD), plasma-enhanced chemical vapor deposition (PECVD), atmospheric-pressure plasma-enhanced chemical vapor deposition, plating, or the like.

(Forming First Metal Layers and Second Metal Layers)

Figure 8C:
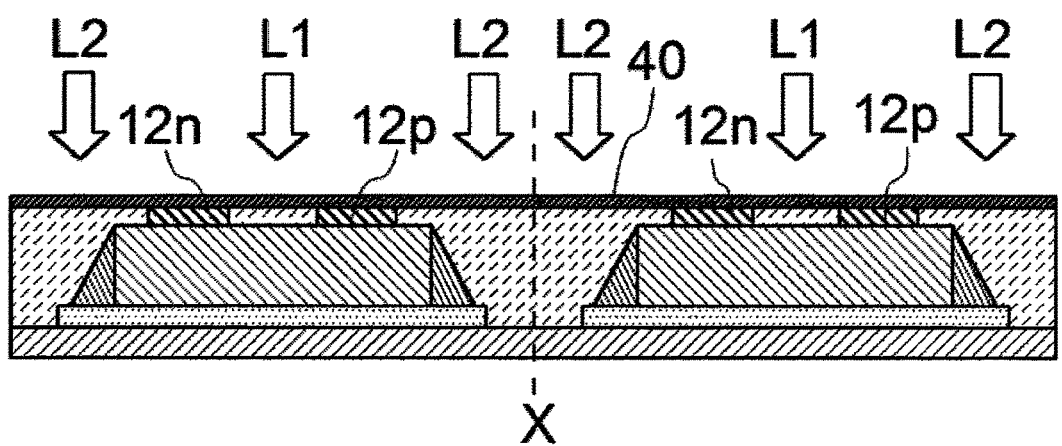
FIG. 8C is a schematic sectional view for illustrating the method for manufacturing the light-emitting devices according to the embodiments.
Figure 9:
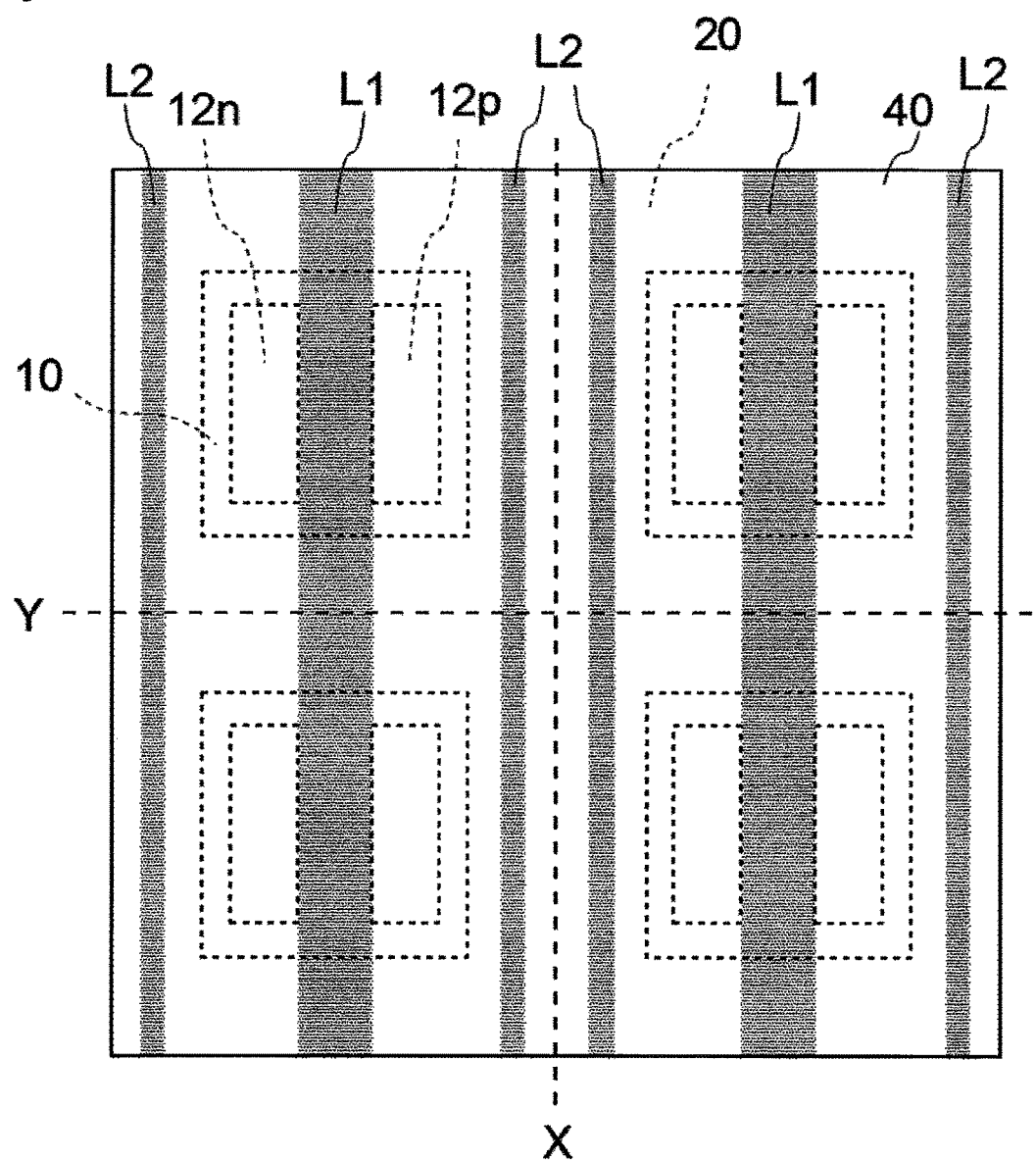
FIG. 9 is a schematic bottom view for illustrating the method for manufacturing the light-emitting devices according to the embodiments.

Subsequently, as shown in FIG. 8C, the metal layer 40 is irradiated with laser light (arrows in FIG. 8C). FIG. 9 is a schematic bottom view of FIG. 8C. Regions (gray portions) irradiated with the laser light include irradiated regions L1 between the pairs of electrodes 12*p* and 12*n* of the light-emitting elements and irradiated regions L2 separated from both of a position of cutting indicated by the dashed line X and the pairs of electrodes 12*p* and 12*n*. Regularly arranging the light-emitting elements 10 facilitates continuously irradiating a plurality of light-emitting elements with the laser light.

Figure 8D:
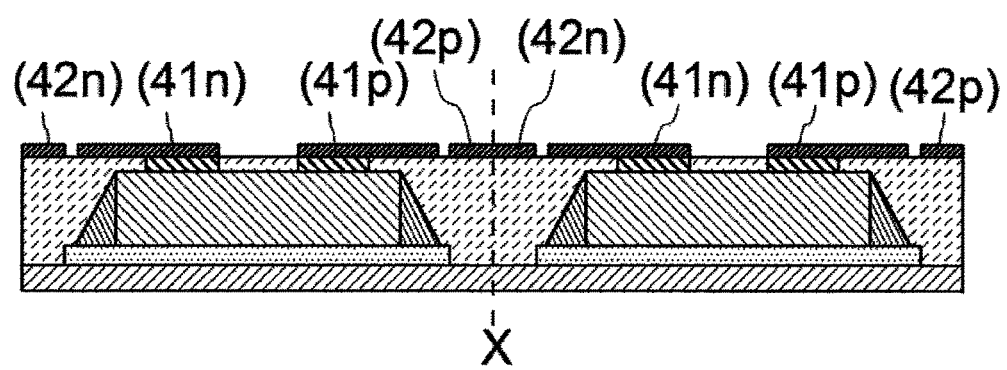
FIG. 8D is a schematic sectional view for illustrating the method for manufacturing the light-emitting devices according to the embodiments.

The regions L1 irradiated with the laser light each have substantially the same width as the width between the electrodes 12*p* and 12*n* of each of the light-emitting elements. The metal layer 40 is removed by laser ablation in the regions L1 irradiated with the laser light. This removal exposes the covering member 20 between the pair of electrodes 12p and 12n of the light-emitting element as shown in FIG. 8D. The metal layer 40 is removed and the covering member 20 is exposed also in the regions L2 irradiated with the laser light in the same manner. This removal divides the metal layer, thereby forming portions to be the first metal layers and portions to be the second metal layers.

The laser light can be applied to the metal layer by continuously or successively moving its irradiation spot on the member. Continuous or pulsed laser light may be applied. The intensity, the diameter of the irradiation spot, and the moving speed of the irradiation spot of the laser light can be selected in consideration of thermal conductivities of the covering member and the metal layer and the difference in their thermal conductivities so that laser ablation of the metal layer on the covering member takes place.

The wavelength of the laser light is preferably less reflected by the metal layer. For example, a wavelength the reflectance at which is 90% or less is selected. For example, in the case where the outermost surface of the metal layer is made of Au, laser light having a shorter emission wavelength in the green region (for example, 550 nm) is preferred to laser light in the red region (for example, 640 nm). This constitution can improve the efficiency of ablation and enhance mass production.

The laser light applied to the metal layer formed on the electrodes of the light-emitting element does not remove the metal layer. Hence, the laser light can be applied in the lateral direction across the center of the light-emitting device as illustrated by, for example, the light-emitting device 5H shown in FIG. 5H. If the laser light is continuously applied to the lower surface of the light-emitting device 5H from the left side, the second metal layer 425hn, the first metal layer 415hn, the first metal layer 415hp, and the second metal layer 425hp are irradiated with the laser light in this order. Even in the case where two first metal layers and the covering member between the electrodes are irradiated with the laser light, the first metal layers are not removed. Hence, only the metal layers formed on the covering member are removed, thereby forming the first metal layers having the recesses R as shown in FIG. 5H. Such recesses can be used in the embodiments other than FIG. 5H.

(Singulating)

Figure 8E:
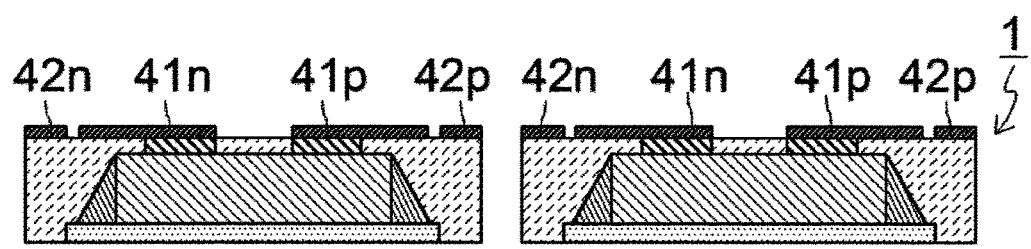
FIG. 8E is a schematic sectional view for illustrating the method for manufacturing the light-emitting devices according to the embodiments.

The light-emitting device 1 including the first metal layers 41p and 41n and the second metal layers 42p and 42n as shown in FIG. 8E can be obtained through singulation by cutting the metal layers and the covering member 20 between adjacent light-emitting elements (along the cutting lines indicated by the dashed lines X and Y in the drawings) and removing the sheet 51. The light-emitting device 1 shown in FIG. 8E is the same as the light-emitting device 1 shown in FIG. 1.

Irradiating part of the metal layer disposed on the entire lower surface of the intermediate structure with the laser light can remove the irradiated portion of the metal layer and expose the covering member as described above. Hence, the first metal layers and the second metal layers in the second to seventh embodiments can be provided by changing the irradiated regions.

The metal layer formed on the electrodes of the light-emitting element is not removed by irradiation with the laser light. Hence, in the case where the laser light is applied to a region including part or the whole of the metal layer on the electrodes of the light-emitting element, the metal layer on the covering member is removed, and the metal layer on the electrodes is not removed. Accordingly, in the case where the laser light is applied to such a region, the region irradiated with the laser light can be different from the region where the remaining metal layer is formed.

The light-emitting device in each embodiment can be bonded to the wiring board via electrically-conductive bonding members such as solder to constitute a light-source module. The type, size, shape, and the like of the wiring board can be selected as appropriate depending on the purpose and the intended use. Either a rigid substrate or a flexible substrate may be used as the wiring board. Also, the number and arrangement of the light-emitting devices bonded to one wiring board can be selected as appropriate depending on the purpose and the intended use. In this case, a plurality of light-emitting devices having the same emission color or different emission colors can be disposed.

Constituent members used in the embodiments will be described below.

(Intermediate Structure)

The intermediate structure includes the light-emitting elements and a resin member covering the surfaces of the light-emitting elements so that the electrodes of the light-emitting elements are exposed. As the resin member, the light-transmissive member and the light-shielding covering member can be included. Intermediate structures having various constitutions can be used in the embodiments.

Figure 10:
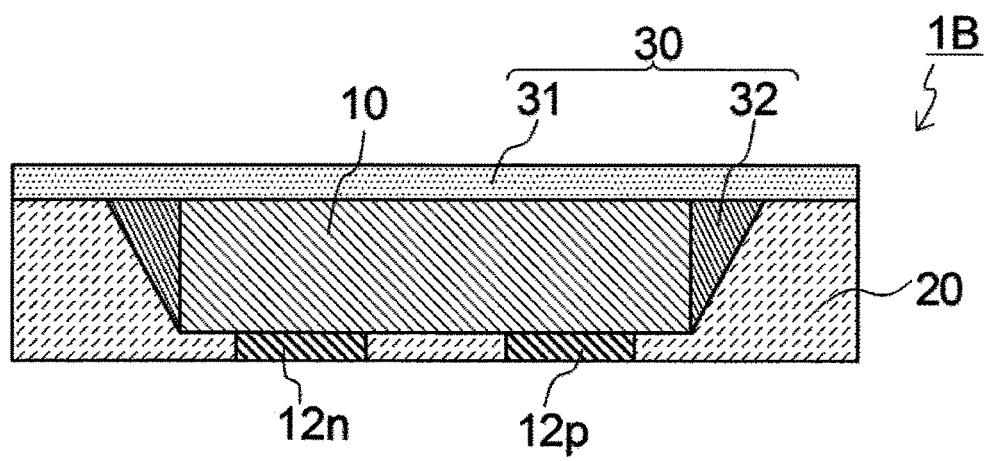
FIG. 10 is a schematic sectional view of an intermediate structure for the light-emitting devices according to the embodiments.

The intermediate structure 1A shown in FIG. 8C is the portion except for the metal layers in FIG. 1C, and therefore the same descriptions as the descriptions of the light-emitting device 1 are omitted. An intermediate structure 1B shown in FIG. 10 includes the first light-transmissive member 31 covering the upper surface of the light-emitting element 10, the upper surface of the covering member 20, and the upper surface of the second light-transmissive member. The covering member 20 covers the lateral surfaces of the second light-transmissive member 32 disposed on the lateral surfaces of the light-emitting element. The covering member 20 covers the light-emitting element so that the electrodes 12p and 12n formed on the lower surface of the light-emitting element are exposed.

Figure 11:
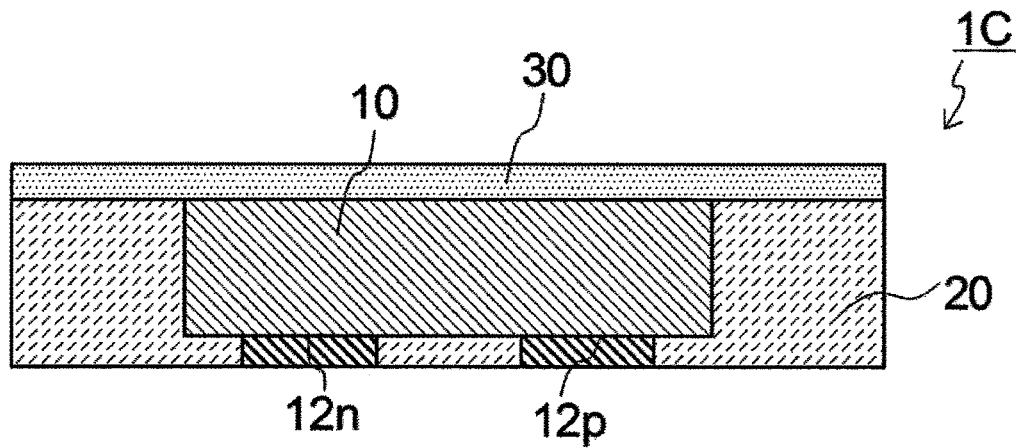
FIG. 11 is a schematic sectional view of an intermediate structure for constituting the light-emitting devices according to the embodiments.

An intermediate structure 1C shown in FIG. 11 does not include the light-transmissive member on the lateral surfaces of the light-emitting element. The light-transmissive member 30 covering the upper surface of the light-emitting element and the upper surface of the covering member 20 is included. The covering member 20 covers the lateral surfaces of the light-emitting element and covers the lower surface of the light-emitting element so that the electrodes 12p and 12n formed on the lower surface of the light-emitting element are exposed.

Figure 12:
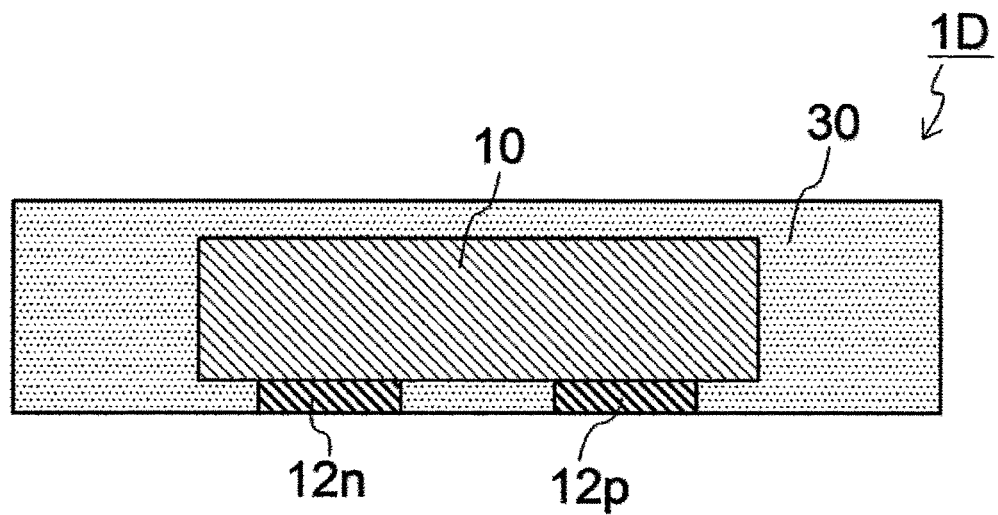
FIG. 12 is a schematic sectional view of an intermediate structure for constituting the light-emitting devices according to the embodiments.

An intermediate structure 1D shown in FIG. 12 does not include the light-shielding covering member. The light-transmissive member 30 covers the surfaces except for the electrodes 12p and 12n, that is, the upper surface, the lateral surfaces, and the lower surface, of the light-emitting element 10.

The light-emitting element constituting the intermediate structure can be, for example, a semiconductor light-emitting element such as a light-emitting diode, and a light-emitting element that can emit visible light such as blue, green, and red light or ultraviolet light can be used. The semiconductor light-emitting element includes the layered structure including a light-emitting layer, and the electrodes. The layered structure has the surface (surface with electrodes) on which the electrodes are formed and the opposite surface serving as the light-extracting surface.

The layered structure includes the semiconductor layers including the light-emitting layer. A light-transmissive substrate such as a sapphire substrate may be further included. An example of the semiconductor layered body can include semiconductor layers of a first conductive semiconductor layer (such as an n-type semiconductor layer), the light-emitting layer (active layer), and a second conductive semiconductor layer (such as a p-type semiconductor layer). Semiconductor layers that can emit ultraviolet light or visible light in the blue to green region can be formed of, for example, a semiconductor material such as a group III-V compound semiconductor. Specifically, a nitride semiconductor material such as $In_XAl_YGa_{1-X-Y}N$ ($0 \leq X$, $0 \leq Y$, $X+Y \leq 1$) can be used. Examples of a semiconductor layered body that can emit red light include GaAs, GaAlAs, GaP, InGaAs, and InGaAsP.

The light-emitting element includes the pair of electrodes on the same side (surface with electrodes) of the layered structure. The pair of electrodes each may have a single-layer structure or a layered structure as long as the electrodes have ohmic contact with the layered structure so that the respective current-voltage characteristics are linear or substantially linear. Such electrodes can be formed of a material and structure known in the field of the invention with any thickness. For example, the thickness of the electrodes is preferably ten-odd to three hundred micrometers. A good electrical conductor, suitably a metal such as Cu, can be used for the electrodes. The shape of the electrodes can be selected from various shapes depending on the purpose and the intended use. The pair of electrodes of the light-emitting element may have the same shape or different shapes.

(Light-Transmissive Member)

The light-transmissive member covers at least the upper surface (surface being opposite to the surface with electrodes and serving as the emitting surface) of the light-emitting element. Light from the light-emitting element is emitted to the outside through the light-transmissive member. One or more light-transmissive members may be disposed. In the case where two or more light-transmissive members are disposed, one member can contain a wavelength conversion member, and another member can contain no wavelength conversion member. Also, in the case where two or more light-transmissive members are disposed, at least parts of the members preferably have contact with each other. Parts of or the whole of the members may overlap each other.

A light-transmissive resin, glass, or the like can be used as a light-transmissive material. A light-transmissive resin is particularly preferable, and a thermosetting resin such as silicone resins, modified silicone resins, epoxy resins, and phenolic resins, or a thermoplastic resin such as polycarbonate resins, acrylic resins, methylpentene resin, and polynorbornene resin can be used. A silicone resin, which has good resistance to light and heat, is particularly suitable.

The light-transmissive member may contain a phosphor as the wavelength conversion member in addition to the light-transmissive material. A phosphor that can be excited by light emitted from the light-emitting element is used. Examples of a phosphor that can be excited by a blue light-emitting element or an ultraviolet light-emitting element include cerium-activated yttrium-aluminum-garnet phosphors (YAG:Ce); cerium-activated lutetium-aluminum-garnet phosphors (LAG:Ce); europium and/or chromium-activated nitrogen-containing calcium aluminosilicate phosphors ($CaO-Al_2O_3-SiO_2$); europium-activated silicate phosphors (($Sr,Ba)_2SiO_4$); nitride phosphors such as β-SiAlON phosphors, CASN phosphors, and SCASN phosphors; KSF phosphors ($K_2SiF_6$:Mn); sulfide phosphors; and quantum-dot phosphors. The light-emitting devices that emit various colors (for example, the light-emitting device that emits white light) can be manufactured by combining the phosphors and the blue light-emitting element or the ultraviolet light-emitting element.

Also, the light-transmissive member may contain various fillers and the like for purposes such as adjusting the viscosity.

(Covering Member)

The covering member is preferably a resin member mainly made of a thermosetting resin such as silicone resins, modified silicone resins, epoxy resins, and phenolic resins.

The covering member is preferably a light-reflective resin member. The light-reflective resin is a resin material that has a reflectance for light from the light-emitting element of 70% or more. For example, a white resin is preferable. The light extraction efficiency of the light-emitting device is enhanced because light that has reached the covering member is reflected toward the emitting surface of the light-emitting device.

For example, a light-transmissive resin in which a light-reflective substance is dispersed can be used as the light-reflective resin. Suitable examples of the light-reflective substance include titanium oxide, silicon oxide, zirconium oxide, potassium titanate, aluminum oxide, aluminum nitride, boron nitride, and mullite. A granular, fibrous, or flaky light-reflective substance can be used. A fibrous one is particularly preferable because an effect of reducing the thermal expansion coefficient of the covering member can also be expected.

(Metal Layers)

The metal layers include the first metal layers connected with the electrodes of the light-emitting element, and the one or more second metal layers separated from the first metal layers. A material having better resistance to corrosion and oxidation than those of the electrodes is selected as the metal layers. For example, the outermost layers are preferably made of a platinum metal such as Au and Pt. In the case where the metal layers cover the surface to be soldered of the light-emitting device, Au, which has good solderability, is preferably used for the outermost surfaces.

The metal layers may be each formed of only one layer of a single material or may each have a layered structure of different materials. The metal layers particularly preferably have a high melting point, and examples of their material include Ru, Mo, and Ta. Also, such a metal having a high melting point is sandwiched between each electrodes of the light-emitting element and the outermost layer, the metal can serve as a diffusion preventing layer that can reduce diffusion of Sn contained in solder into the electrode and layers near the electrode. Examples of a layered structure including such a diffusion preventing layer include Ni/Ru/Au and Ti/Pt/Au. The thickness of the diffusion preventing layer (such as Ru) is preferably about 10 Å to 1,000 Å.

The thickness of the metal layers can be selected from various values. The thickness can be in such a range that selective laser ablation takes place and is, for example, preferably 1 μm or less, more preferably 1,000 Å or less. The thickness is preferably in such a range that the corrosion of the electrodes is reduced, such as 5 nm or more. In the case where a plurality of layers constitute each of the metal layers, the thickness of the metal layers herein means the total thickness of the plurality of layers.

Some embodiments according to the present invention have been illustrated above, but the present invention is not limited to the above embodiments. Needless to say, other constitutions within the scope of the present invention are possible.

What is claimed is:

1. A light-emitting device comprising:
a light-emitting element comprising:
   a layered structure comprising a semiconductor layer, and
   a pair of electrodes on a first main surface of the layered structure;
a light-transmissive member on a second main surface of the layered structure, the second main surface being opposite to the first main surface;
a covering member covering:
   lateral surfaces of the light-emitting element, and
   the first main surface of the layered structure except for at least part of the pair of electrodes;
a pair of first metal layers on the first main surface of the light-emitting element, the pair of first metal layers covering first portions of a surface of the covering member and being respectively connected with the pair of electrodes; and
one or more second metal layers separated from the first metal layers and the pair of electrodes, the one or more second metal layers covering one or more second portions of the surface of the covering member,
wherein a width of each of the pair of first metal layers is larger than a width of each of the electrodes of the light-emitting element, and a width of each of the one or more second metal layers is smaller than the width of each of the pair of first metal layers,
wherein the first metal layers are disposed on at least one corner portion of a lower surface of the light-emitting device.

2. The light-emitting device according to claim 1,
wherein the one or more second metal layers comprise at least a pair of second metal layers disposed on both sides of the pair of first metal layers.

3. The light-emitting device according to claim 1,
wherein the one or more second metal layers are adjacent to both of the pair of first metal layers.

4. The light-emitting device according to claim 1,
wherein the one or more second metal layers are disposed on both sides of at least one of first metal layers.

5. A light-source module comprising:
the light-emitting device according to claim 1; and
a wiring board to which the light-emitting device is bonded via a bonding member.

6. A light-emitting device comprising:
a light-emitting element comprising:
   a layered structure comprising a semiconductor layer, and
   a pair of electrodes on a first main surface of the layered structure;
a light-transmissive member on a second main surface of the layered structure, the second main surface being opposite to the first main surface;
a covering member covering:
   lateral surfaces of the light-emitting element, and
   the first main surface of the layered structure except for at least part of the pair of electrodes;
a pair of first metal layers on the first main surface of the light-emitting element, the pair of first metal layers covering first portions of a surface of the covering member and being respectively connected with the pair of electrodes; and
one or more second metal layers separated from the first metal layers and the pair of electrodes, the one or more second metal layers covering one or more second portions of the surface of the covering member,
wherein a width of each of the pair of first metal layers is larger than a width of each of the electrodes of the light-emitting element, and a width of each of the one or more second metal layers is smaller than the width of each of the pair of first metal layers, and
wherein the one or more second metal layers comprise at least two second metal layers facing one side of the first metal layers.

7. The light emitting device according to claim 6,
wherein the at least two second metal layers comprise at least a pair of second metal layers disposed on both sides of the pair of the first metal layers.

8. The light emitting device according to claim 6,
wherein the at least two second metal layers are adjacent to both of the pair of first metal layers.

9. The light emitting device according to claim 6,
wherein the at least two second metal layers are disposed on both sides of at least one of the first metal layers.

10. A light-source module comprising:
the light-emitting device according to claim 6; and
a wiring board to which the light-emitting device is bonded via a bonding member.

* * * * *